United States Patent
Caldwell et al.

(10) Patent No.: US 6,897,390 B2
(45) Date of Patent: May 24, 2005

(54) MOLDED/INTEGRATED TOUCH SWITCH/ CONTROL PANEL ASSEMBLY AND METHOD FOR MAKING SAME

(75) Inventors: David W. Caldwell, Holland, MI (US); Kevin C. Bird, Holland, MI (US); William D. Schaefer, Grand Rapids, MI (US)

(73) Assignee: TouchSensor Technologies, LLC, Wheaton, IL (US)

( * ) Notice: Subject to any disclaimer, the term of this patent is extended or adjusted under 35 U.S.C. 154(b) by 0 days.

(21) Appl. No.: 10/272,219

(22) Filed: Oct. 15, 2002

(65) Prior Publication Data

US 2003/0121767 A1 Jul. 3, 2003

Related U.S. Application Data

(60) Provisional application No. 60/341,551, filed on Dec. 18, 2001, provisional application No. 60/341,550, filed on Dec. 18, 2001, provisional application No. 60/341,350, filed on Dec. 18, 2001, and provisional application No. 60/334,040, filed on Nov. 20, 2001.

(51) Int. Cl.[7] ................................. H01H 13/00
(52) U.S. Cl. .......................... 200/512; 29/622
(58) Field of Search ................. 29/622; 178/18, 178/19; 200/600, 512; 345/173

(56) References Cited

U.S. PATENT DOCUMENTS

| | | | | |
|---|---|---|---|---|
| 5,543,587 A | * | 8/1996 | Ikura et al. | 178/18.01 |
| 5,574,623 A | * | 11/1996 | Girard | 361/627 |
| 5,594,222 A | | 1/1997 | Caldwell | 200/600 |
| 5,721,666 A | | 2/1998 | Girard | 361/627 |
| 5,926,171 A | * | 7/1999 | Matsufusa et al. | 345/173 |
| 6,424,339 B1 | * | 7/2002 | Randall | 345/173 |

* cited by examiner

*Primary Examiner*—Michael A. Friedhofer
(74) *Attorney, Agent, or Firm*—Jenner & Block LLP

(57) ABSTRACT

Touch switches are integrated with thermoformable, injection molded, and other substrates to yield integrated touch switch/control panel assemblies. The ensuant assemblies can include ridges, depressions, anchors, overlaps, rivets and bezels or other housings. They can have any combination of flat and curved surfaces. Further, such assemblies can be incorporated into components of other assemblies, such as automobiles.

52 Claims, 27 Drawing Sheets

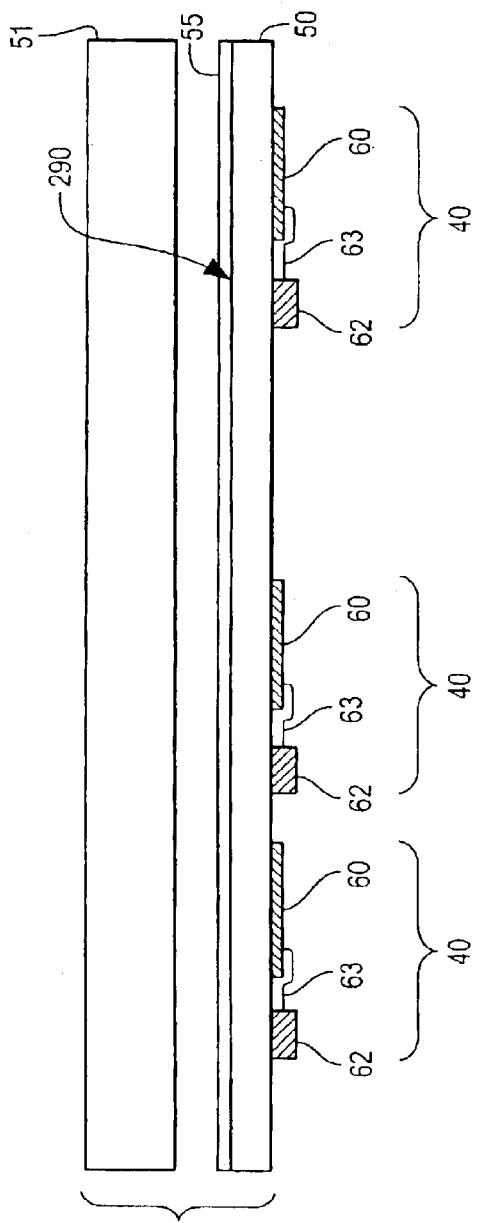
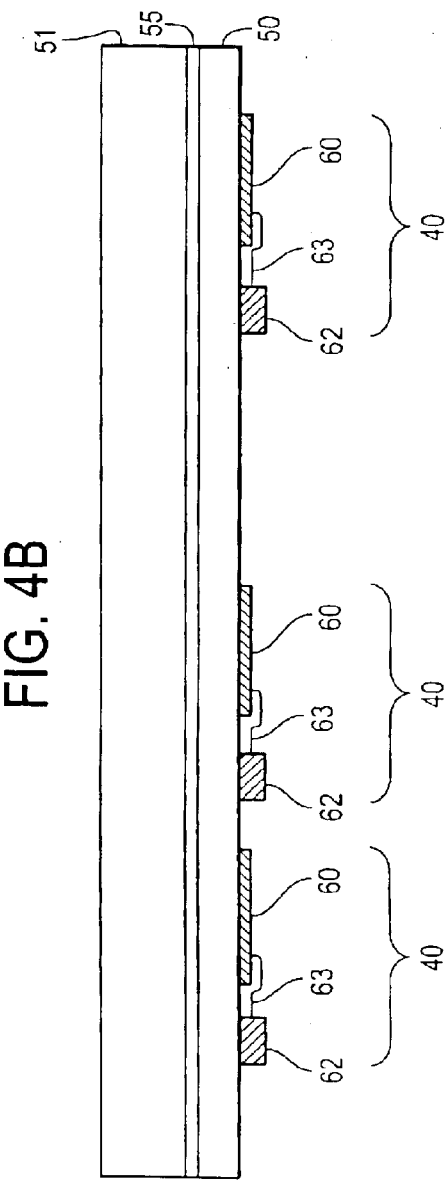

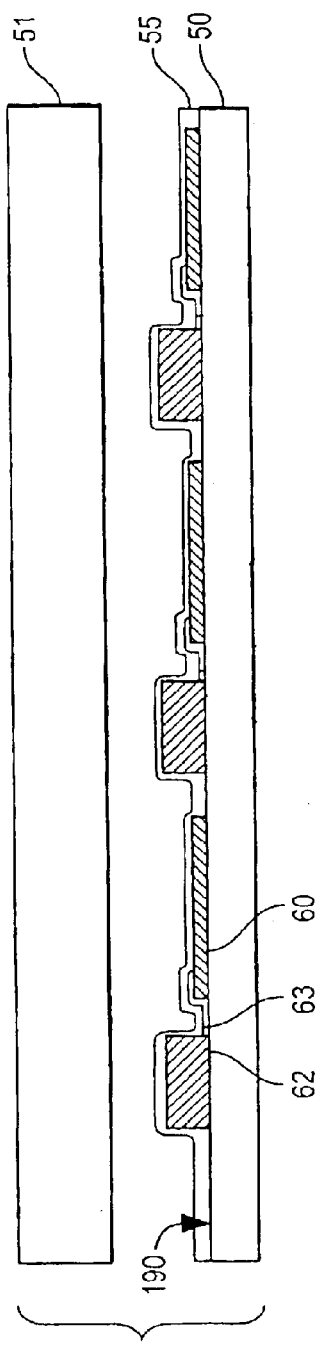
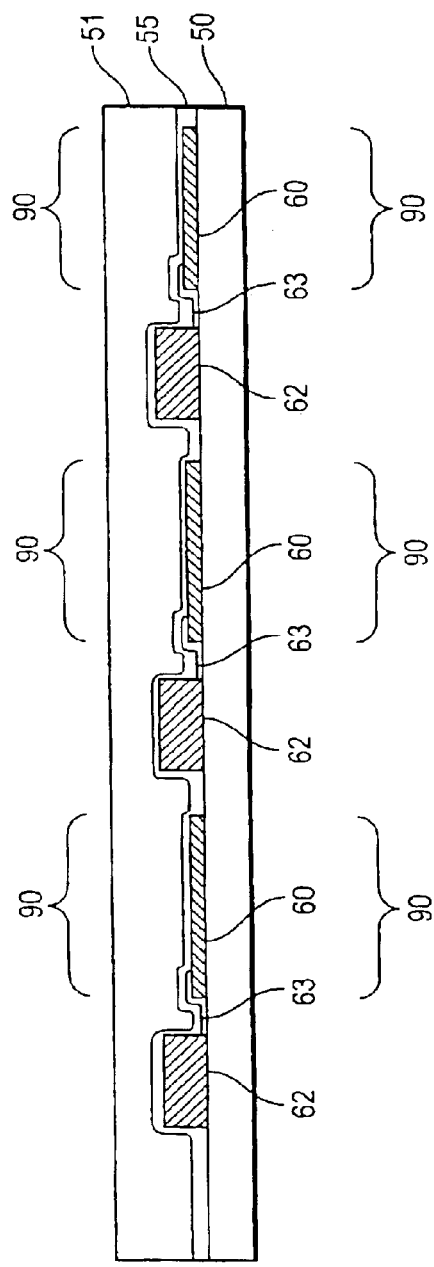

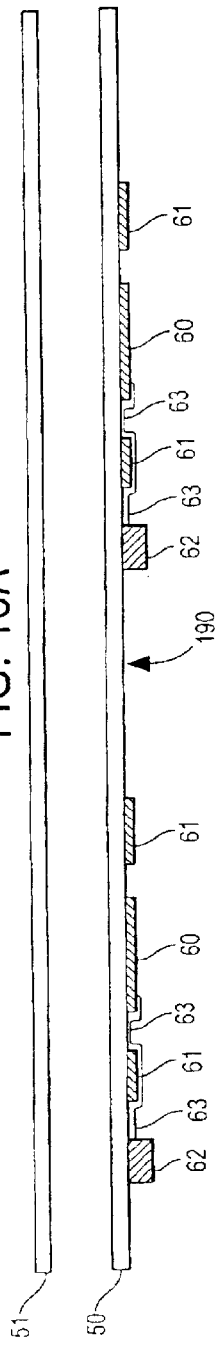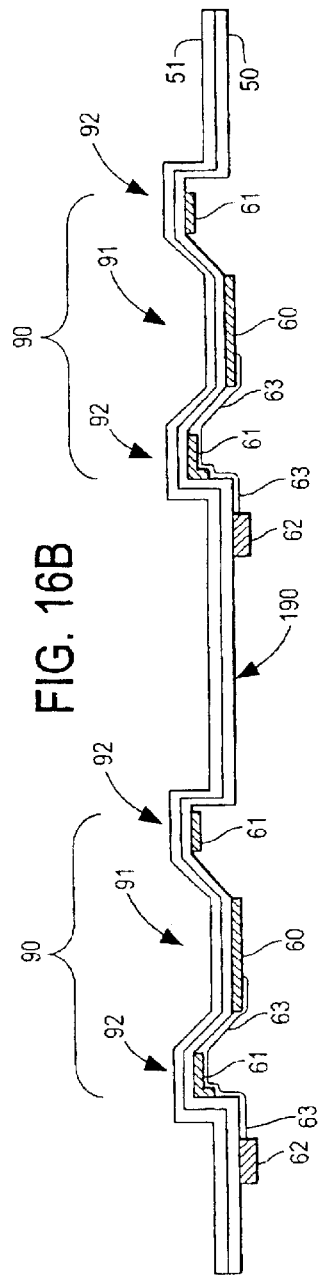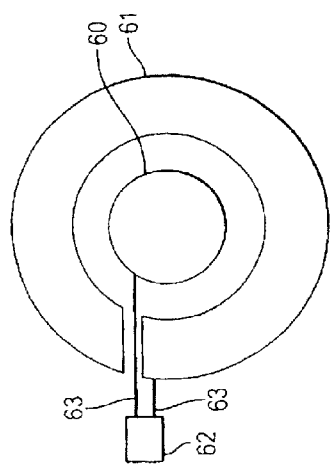

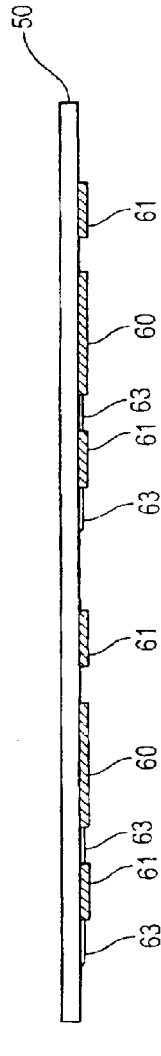
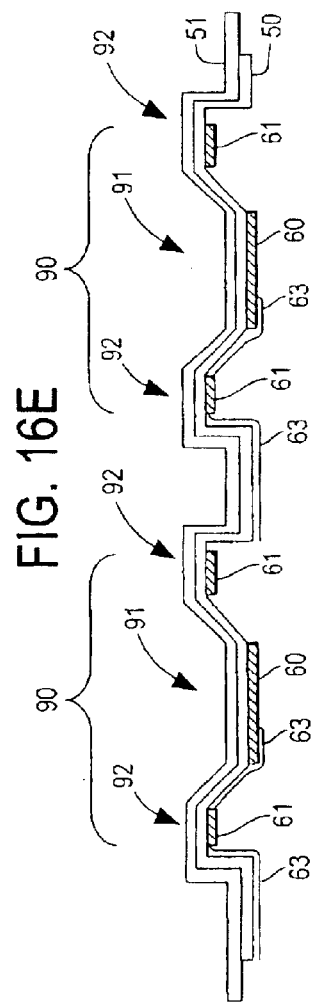
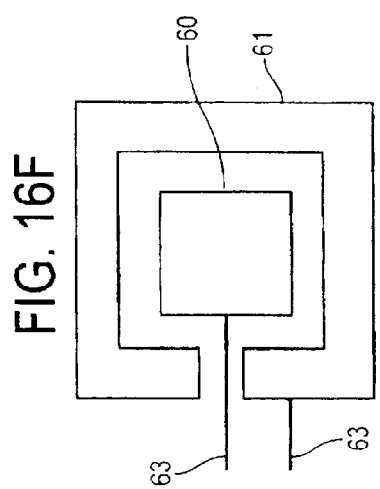
FIG. 16D
FIG. 16E
FIG. 16F

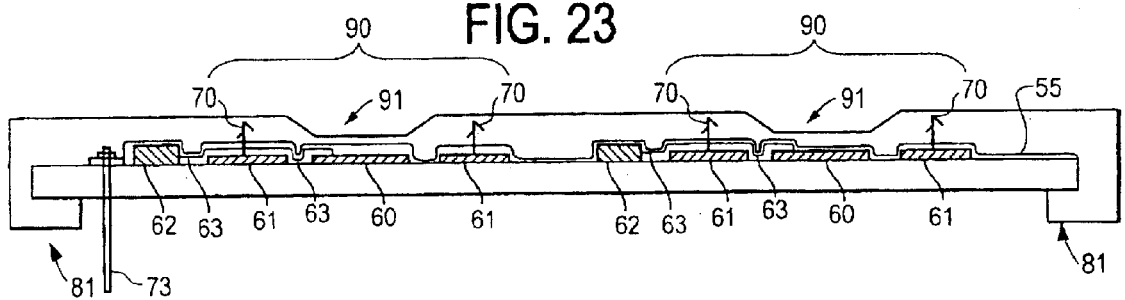
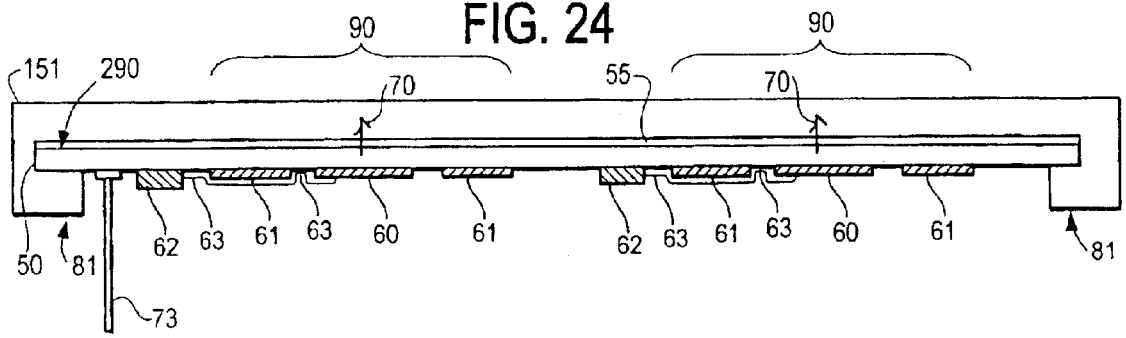
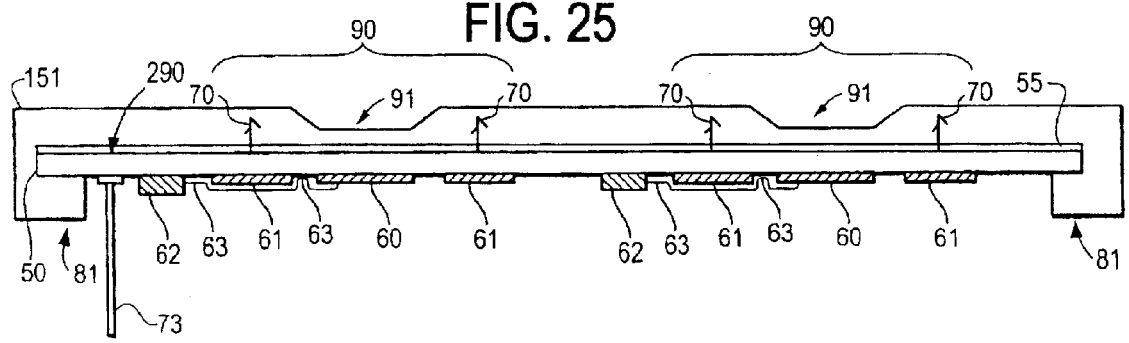
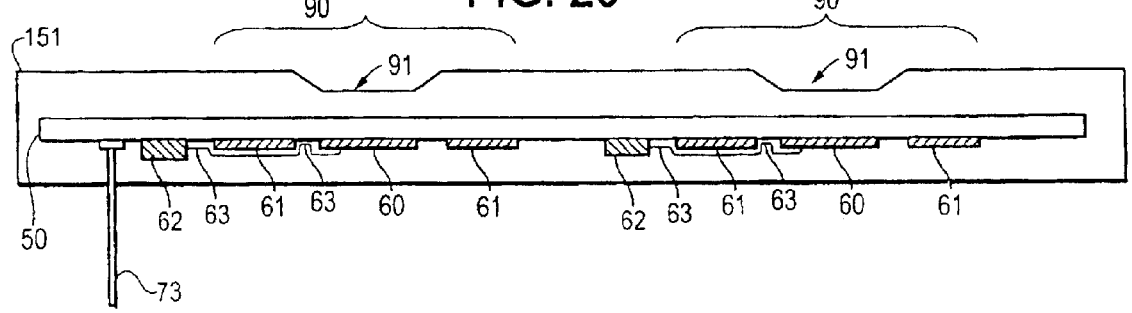

MOLDED/INTEGRATED TOUCH SWITCH/CONTROL PANEL ASSEMBLY AND METHOD FOR MAKING SAME

CROSS-REFERENCE TO RELATED APPLICATIONS

This application claims priority from U.S. Provisional Patent Applications No. 60/334,040, filed on Nov. 20, 2001; and Nos. 60/341,350, 60/341,550 and 60/341,551, filed on Dec. 18, 2001. The disclosures of these applications are hereby incorporated herein by reference.

BACKGROUND OF THE INVENTION

1. The Technical Field

The present invention relates to touch switches. More particularly, it relates to the integration of touch switches into control panels and other substrates using molding techniques such as thermoforming, injection molding, and the like.

2. The Prior Art

Touch switches have many advantages over and have long been used as replacements for mechanical switches. Known touch switches typically include a touch pad and an associated control circuit. Such a touch pad typically consists of one or more electrodes and, in some cases, other electronic components, mounted on a rigid or flexible carrier. The associated control circuit can be mounted on the carrier proximate the touch pad or distant from the touch pad, or elsewhere. The touch switch carrier typically is attached to another pre-formed panel having one or more touch surfaces corresponding to the touch pads on the touch switch carrier. This panel, or touch surface substrate (also referred to herein as a control panel and/or control panel substrate), typically is made of glass or plastic and can include structure and features that provide an ergonomic or decorative control panel interface. The touch switch carrier typically is attached to the touch surface substrate using mechanical means such as stud and bracket structures, snap-in plastic assemblies, adhesives or a combination of these and other mechanical attachment structures and techniques.

A user typically actuates such a touch switch by touching or approaching with an appendage or other object a corresponding touch surface on the touch surface substrate, thus causing a response in the touch switch's associated control circuit. This response can be affected by factors such as separation (distance) between the touch pad and the touch surface and material properties of the panels comprising the touch switch carrier and the touch surface substrate, among others. Further details regarding the design and operation of touch switches can be found in, for example, U.S. Pat. Nos. 5,594,222, 5,856,646, 6,310,611 and 6,320,282 B1.

While the foregoing conventional assembly techniques generally are effective, they sometimes provide less than optimal integration of the touch switch carrier to the touch surface substrate, thus potentially adversely affecting the operation of the touch switch. For instance, stud and bracket attachment methods sometimes yield inconsistent spacing between touch pads and the corresponding touch surfaces on the touch surface substrate because of mechanical irregularities in the attachment components, the touch switch carrier, and/or the touch surface substrate. Also, stud and bracket assemblies can come apart, particularly in vibratory or other harsh environments. Simple adhesive attachment methods can yield inconsistent spacing between touch switches and corresponding touch surfaces in cases where adhesive is unevenly applied between the touch switch carrier and the touch surface substrate. Also, bubbles and other inconsistencies in the composition of the adhesive itself can adversely affect the performance of the touch switch.

Further, the foregoing conventional techniques impose limitations on the design of the final touch switch/touch surface interface. For instance, the pre-formed substrates to which touch switches are conventionally attached typically are flat to facilitate the fabrication and attachment processes. Attaching a touch switch to a non-flat substrate using conventional attachment techniques can pose problems related to the complexity of the attachment process and the surety of the attachment itself.

SUMMARY OF THE INVENTION

The present invention overcomes shortcomings of the prior art by integrating touch switch carriers with other substrates which then serve as control panels having touch surfaces corresponding to the underlying touch switches. For example, the present invention integrates touch switches and their carriers with touch surface substrates using molding processes such as thermoforming or injection molding and the like. Mechanical anchors and adhesives can be used in connection with such molding techniques to further ensure positive engagement of individual components into an integrated touch switch/control panel assembly.

Integrated touch switch/control panel assemblies according to the present invention can include depressions and ridges that provide tactile feedback to a user and can include bezels and housings that frame the user interface portion of the molded substrates. Also, integrated touch switch/control panel assemblies according to the present invention can be embodied as components of larger and more complex assemblies. For example, the present invention could be used to integrate touch switches for operating an automobile's electric windows into the automobile's door panels or center console. The integrated touch switch/control panel assemblies of the present invention can simplify the manufacturing process, reduce manufacturing costs, optimize touch switch performance, allow more flexibility in touch switch design and, thereby and otherwise, increase the number and type of applications for which touch switches are suitable.

BRIEF DESCRIPTION OF THE DRAWINGS

FIGS. 4A–4D show integrated touch switch assemblies formed by bonding touch switch carriers to thermoformable touch surface substrates;

FIGS. 5A–5B show an integrated touch switch assembly having a thermoformable touch surface substrate that conforms to components disposed on a rigid touch switch carrier;

FIGS. 16A–16F show an integrated touch switch assembly similar to that shown in FIGS. 15A–15D but having ridges defining the touch surfaces;

FIGS. 19–26 show integrated touch switch assemblies in various configurations evidencing the principles of the present invention depicted in FIGS. 4A–18D, but formed using injection molding techniques;

DETAILED DESCRIPTION OF THE ILLUSTRATED EMBODIMENTS

While the drawings generally depict capacitive and electric field touch switches for the purpose of illustration, the principles of the present invention can be seen by those skilled in the art as appropriate for any manner of touch switch device, including, but not limited to, capacitive touch switches, infrared touch switches, electric field touch switches, acoustic touch switches and electromagnetic touch switches. Specific examples include the touch switches described in U.S. Pat. Nos. 5,594,222, 5,856,646, 6,310,611 and 6,320,282, each naming David W. Caldwell as inventor. The disclosures of the foregoing U.S. patents are hereby incorporated herein by reference. The disclosures of U.S. patent applications Ser. No. 10/271,933, entitled Intelligent Shelving System, No. 10/272,377, entitled Touch Switch with Integrated Control Circuit, No. 10/272,047, entitled Touch Sensor with Integrated Decoration, and No. 10/271,438, entitled Integrated Touch Sensor and Light Apparatus, all filed on Oct. 15, 2002 and all naming David W. Caldwell as an inventor, are also hereby incorporated herein by reference.

Figure 1A:
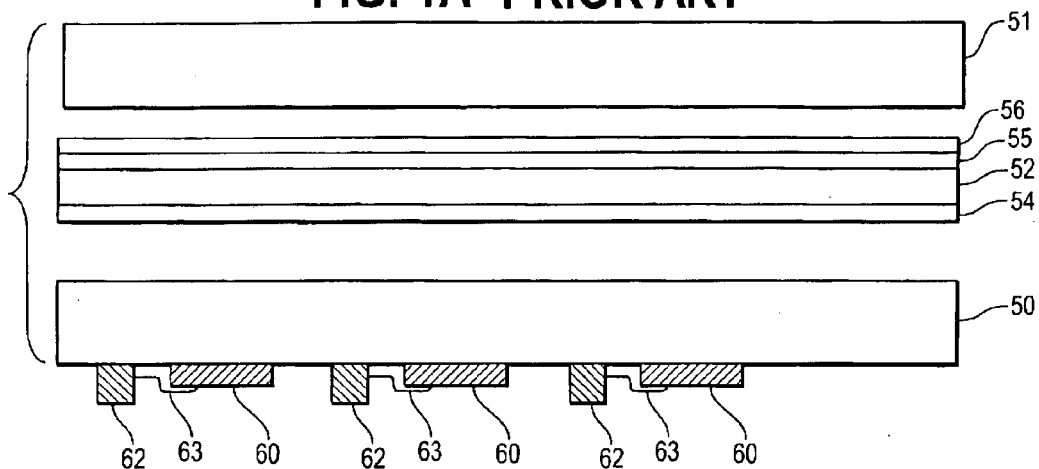
FIGS. 1A–1F show an embodiment of an adhesive carrier substrate attaching a touch switch carrier to a touch surface substrate.
Figure 1B:
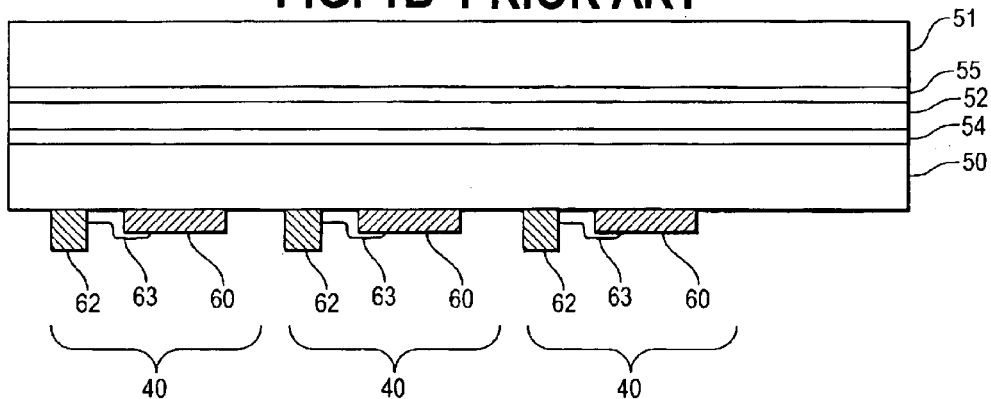
Figure 1C:
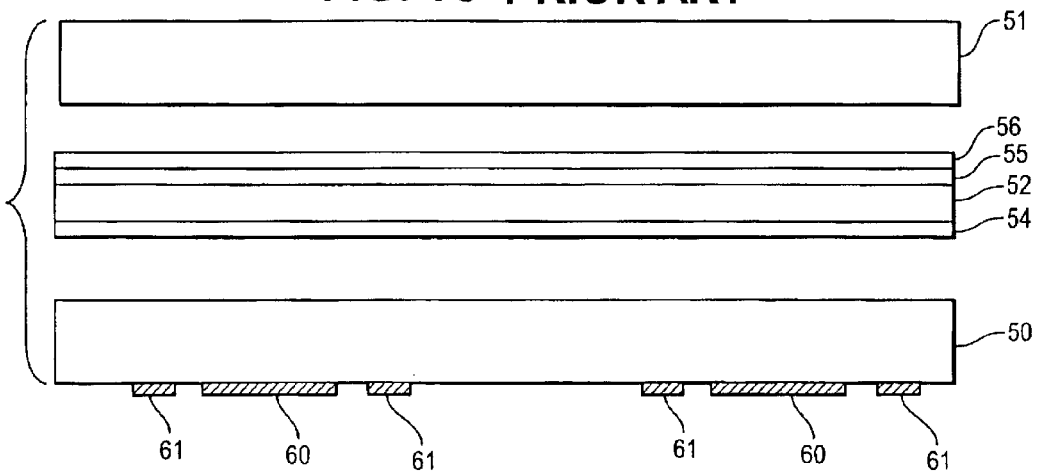
Figure 1D:
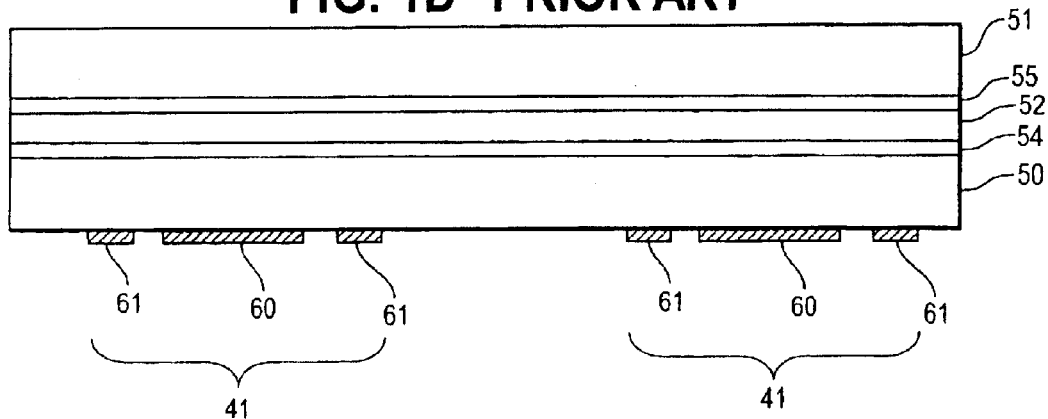
Figure 1E:
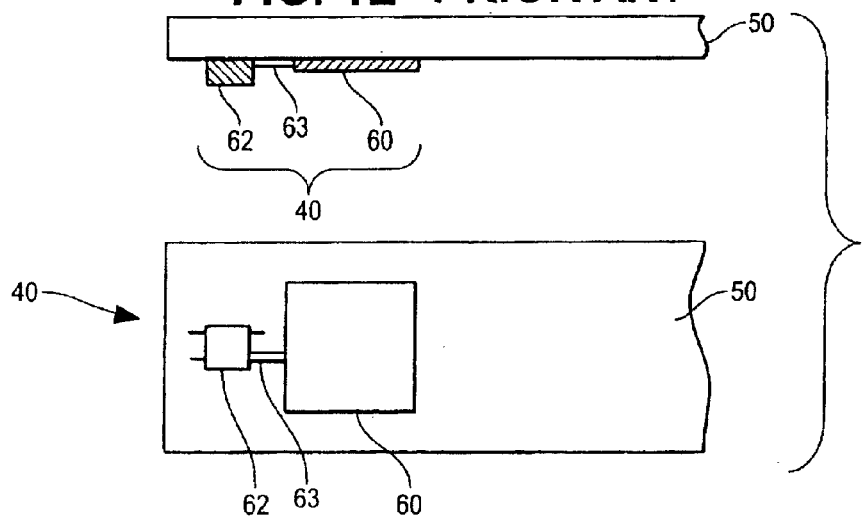
Figure 1F:
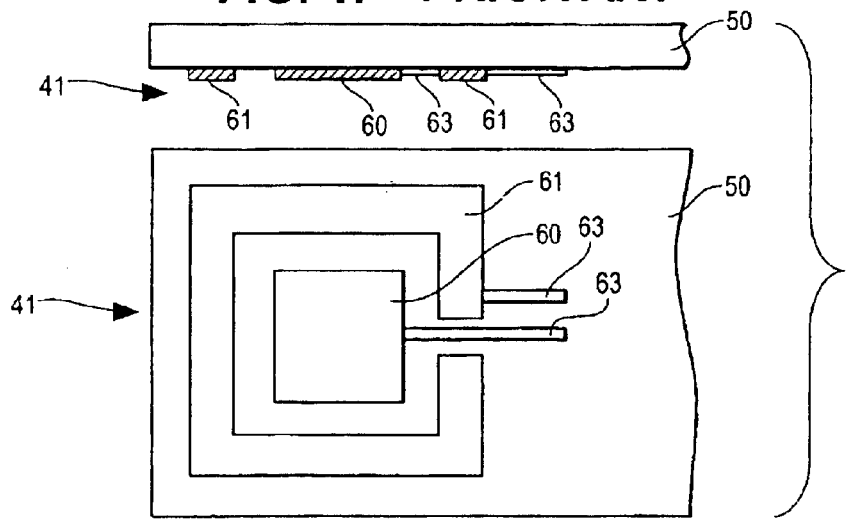

FIGS. 1A–1F depict known methods of attaching touch switch carriers to touch surface substrates to form a touch switch/control panel assembly. FIG. 1A shows the individual layers of the touch switch/control panel assembly shown in FIG. 1B. The assembly includes touch switch carrier 50 bearing three touch switches 40, each comprising an electrode 60, an integrated control circuit 62 and an electrical trace 63; touch surface substrate 51; and adhesive carrier substrate 52 having adhesive layers 54 and 55 and liner 56 covering adhesive layer 55. Other embodiments can include more or fewer than three touch switches, or touch switches having different configurations. Liner 56 must be removed to expose adhesive layer 55, whereupon substrate 51 can be attached to touch switch carrier 50, as shown in FIG. 1B. FIGS. 1C–1D show a similar attachment technique wherein the touch switch is embodied as a capacitive touch switch 41 not having an integrated control circuit. The touch switches 41 shown in FIGS. 1C–1D and 1F include both inner electrode 60 and outer electrode 61, making them suitable for use with a differential control circuit (not shown). The touch switch 40 of FIG. 1E includes a single electrode 60, integrated control circuit 62 and trace 63 connecting the two. Either of the foregoing touch switch configurations, as well as other configurations, could be used with all of the embodiments of the present invention. In some embodiments, a single electrode 60 is preferred, while in others the dual electrode configuration of FIG. 1F is preferred. Other touch switch configurations are possible as well, including touch switches having additional electrodes, electrodes of various shapes and sizes, and/or the omission or addition of integrated control circuits where shown or not shown, respectively.

Figure 2A:
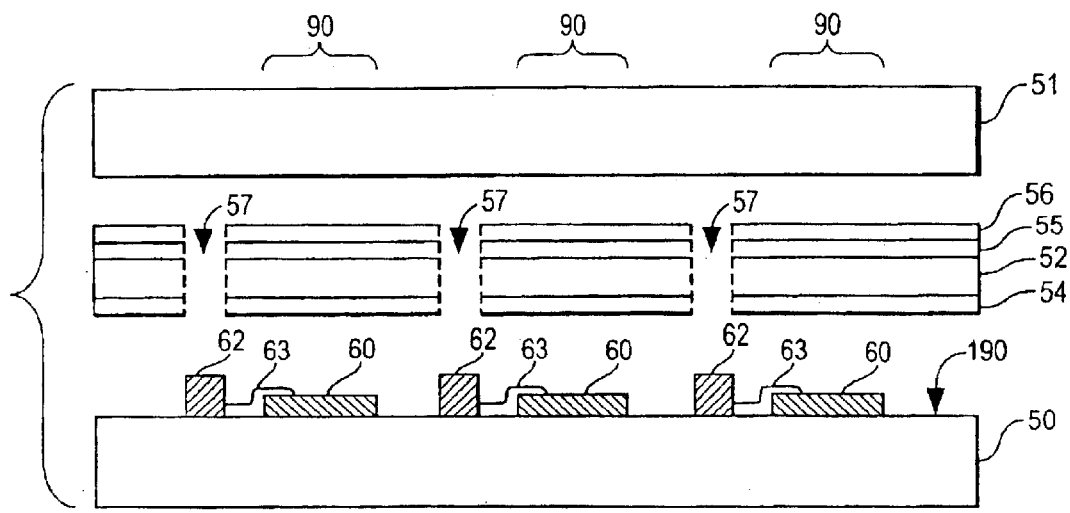
FIGS. 2A–2B show another embodiment of an adhesive carrier substrate attaching a touch switch carrier to a touch surface substrate, wherein the adhesive carrier substrate is configured to conform to components disposed on the touch switch carrier.
Figure 2B:
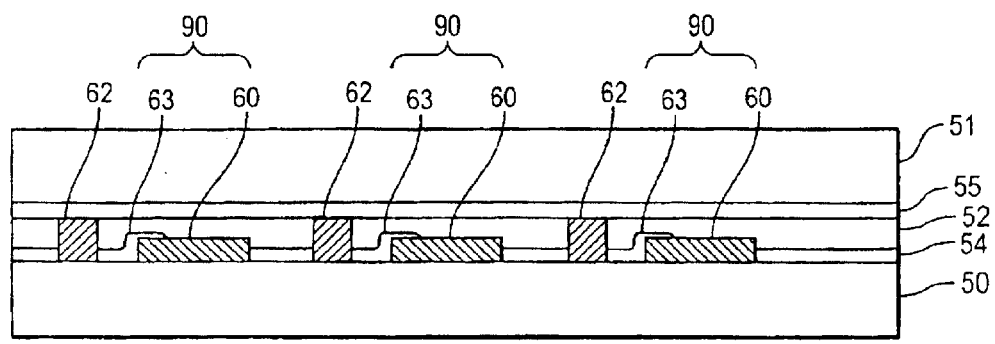

FIG. 2A shows the individual layers of the touch switch/control panel assembly shown in FIG. 2B. In FIGS. 2A–2B, substrate 51 is bonded to component bearing side 190 of touch switch carrier 50 using an adhesive carrier substrate 52. This design reduces the separation between touch surface 90 on touch surface substrate 51 and electrodes 60.

Adhesive carrier substrate 52 includes cut-out sections 57 to provide clearance for integrated control circuit components 62.

Figure 3A:
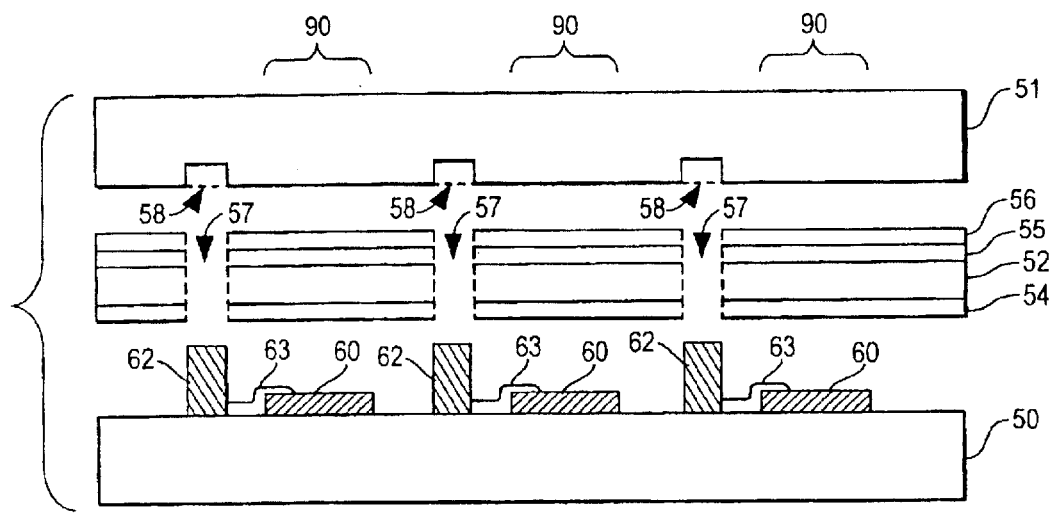
FIGS. 3A–3B show the adhesive carrier substrate of FIGS. 2A–2B attaching a touch switch carrier to a touch surface substrate which is configured to conform to components disposed on the touch switch carrier.
Figure 3B:
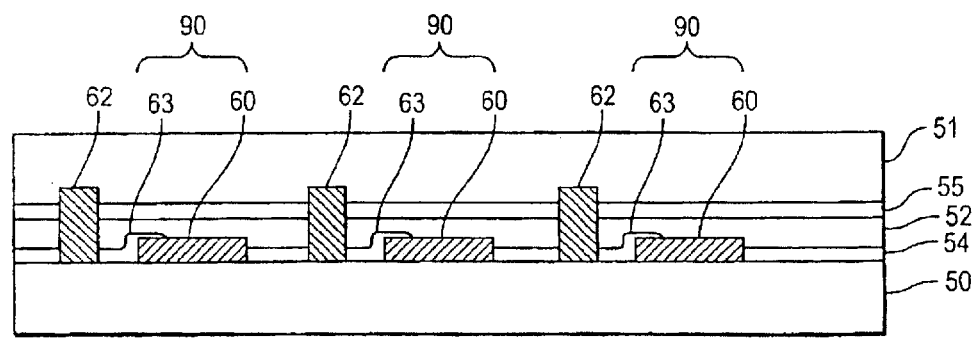

FIG. 3A shows the individual layers of the touch switch/control panel assembly shown in FIG. 3B. These figures are similar to FIGS. 2A and 2B, except that they further illustrate cut-out sections 58 in substrate 51 which provide additional clearance for integrated control circuit components 62. In FIGS. 2A–3B, electrode 60, trace 63 and integrated control circuit 62 advantageously are protected from the environment, but substantial effort is needed to fabricate the adhesive carrier assembly (and the touch surface substrate 51 of FIGS. 3A–3B) to provide clearance for integrated control circuits 62.

The integrated touch switch/control panel assemblies of the present invention can avoid the problems associated with known adhesive attachment techniques and can reduce the complexity of the touch switch manufacturing process. Integration of touch switch carriers with other panels and substrates according to the present invention also affords more flexibility in creating control panel interfaces that provide user feedback. For instance, the present invention allows for integration of flexible or formable touch switch carriers with other substrates using injection molding, thermoforming or similar techniques that shape the resulting touch switch into ergonomic configurations. Integrated touch switch/control panel assemblies according to the present invention can exhibit texture, depressions and ridges proximate the touch surface that tactilely inform a user of the areas on a control panel that can be touched to produce a desired response.

Integrated touch switch/control panel assemblies can have other advantages over conventional touch switch and control panel assemblies. For instance, the invention allows touch switches to be integrated into structures that themselves would normally be thermoformed or injection molded, such as the dashboard or interior door panels of a car. Further, molding, forming and other techniques compatible with the present invention can more efficiently produce touch switch/control panel assemblies with enhanced mechanical integration. For instance, the present invention can employ ultrasonic welding techniques which can reduce material and tooling requirements (by reducing the need for adhesives), labor costs (ultrasonic welding can be automated) and can ensure tight mechanical integration (by using such techniques to form rivets or to otherwise meld a touch switch carrier and touch surface substrate together).

In addition, touch switches integrated into control panels according to the present invention can be especially sensitive and can produce especially high signal levels because the distance separating a user's touch from an electrode can be reduced (compared to prior art techniques) by forming the control panel substrate to a desired level of thinness; in prior art touch switches, the switches' sensitivity is, at least in part, determined by the thickness of the control panel substrate. More of the advantages of the present invention will present themselves to those skilled in the art of touch switch design and application as various embodiments thereof are described below.

FIGS. 4A–18B show the basic embodiments of the present invention involving integrated touch switches with thermoformable substrates, including those formed using simple pressure forming. The thermoformable substrates of FIGS. 4A–18D can be composed of plastic or any thermoformable dielectric material. Thermoforming can involve molding under heat or pressure or both. Depending on the particular thermoformable dielectric substrate to be used, any combination of high or low temperature, including ambient temperature, and high or low pressure could be used according to the present invention.

Figure 4C:
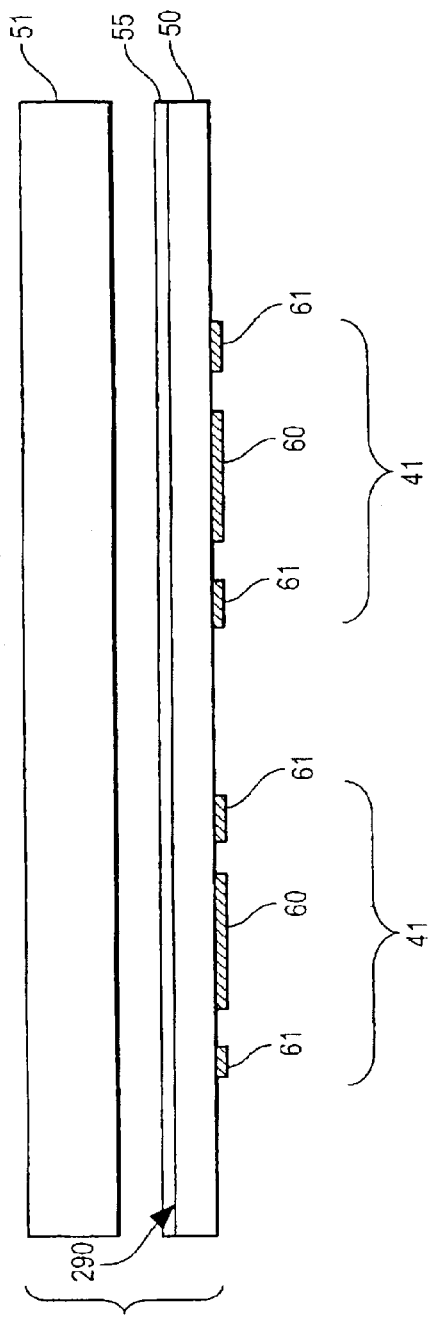

In FIGS. 4A–5B, an adhesive attachment technique is combined with the thermoforming techniques of the present invention. FIG. 4A shows the individual layers of the touch switch/control panel assembly shown in FIG. 4B. This assembly includes three touch switches 40, each including electrode 60, integrated circuit 62, and electrical trace 63, disposed on touch switch carrier 50. Touch switch carrier 50 can be any suitable conventional substrate, including but not limited to printed circuit board, plastic, glass or flexible or thermoformable material. Touch switch carrier 50 is shown in these figures (and in FIGS. 4C–12B) as composed of a rigid material, but flexible carrier substrates can be used instead, as warranted by the particular application. Touch switch carrier 50 could be opaque, transparent or translucent and could include a decorative layer as described below with reference to FIGS. 14A–14B.

Adhesive layer 55 is disposed on side 290 of touch switch carrier 50. Adhesive layer 55 can be composed of any adhesive suitable for use on the touch switch carrier and touch surface substrates, including but not limited to thermoset, thermoplastic, epoxy, heat activated or ultraviolet curable adhesive. Adhesives requiring heat or pressure for their application are especially suitable for the manufacture of thermoformed touch switch/control panel assemblies according to the present invention, as heat and pressure can be inherent elements of the thermoforming process. The thermoforming process can serve to eliminate the inconsistencies that might otherwise occur in (and due to the presence of) adhesive layer 55. For example, the pressure component of the thermoforming process can eliminate the bubbles and unevenness that sometimes occur in the adhesive layer of prior art touch switches, thus overcoming a disadvantage of simple adhesive attachment processes as discussed at the outset.

Figure 4D:
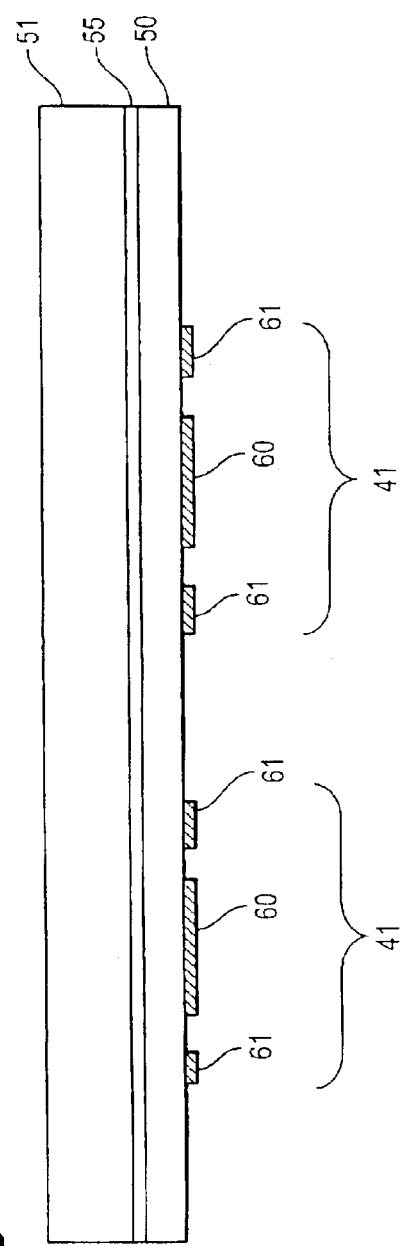

FIGS. 4C–4D are similar to FIGS. 4A–4B, except that FIGS. 4A–4B illustrate touch switches 40 each having single electrode 60 and integrated control circuit 62, while FIGS. 4C–4D illustrate capacitive touch switches 41 each having two electrodes 60 and 61, with no integrated control circuit. Though not illustrated herein, these embodiments, as well as all other embodiments of the present invention involving thermoforming, can include a textured interface that could be created during the thermoforming process on the touched side of the thermoformed assembly or more specifically, overlying operative touch surfaces 90. A textured interface could provide tactile feedback to a user who could more easily locate a particular touch surface.

FIGS. 4A–4D illustrate embodiments wherein adhesive layer 55 is disposed on the non-component bearing side 290 of touch switch carrier 50 which does not bear any touch switch components. FIGS. 5A–5B illustrate an alternate embodiment wherein adhesive layer 55 is disposed on the component bearing side 190 of touch switch carrier 50. FIG. 5A shows the individual layers of the touch switch/control panel assembly shown in FIG. 5B prior to assembly. When touch switch carrier 50 and touch surface substrate 51 are thermoformed together, substrate 51 conforms to electrodes 60, integrated control circuits 62 and traces 63, all of which can become substantially encapsulated between touch switch carrier 50 and substrate 51, effectively protecting the touch switch components and electrical circuitry from moisture and other environmental conditions. Touch surfaces 90 can be located on either side of the finished assembly, as illustrated in FIG. 5B.

Figure 6A:
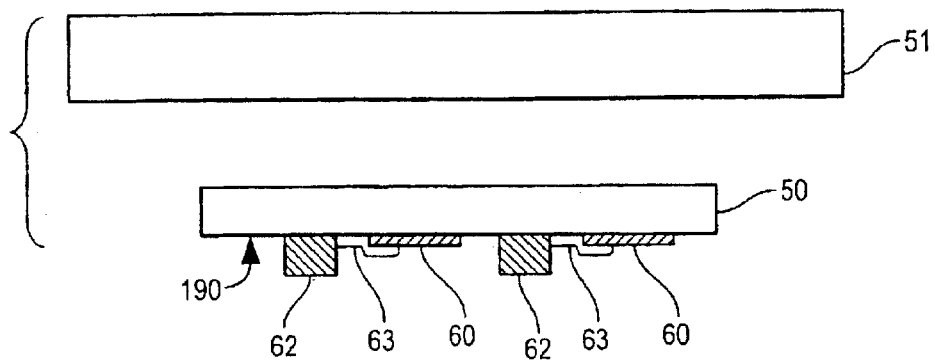
FIGS. 6A–6B show an integrated touch switch assembly having a thermoformable touch surface substrate that conforms to and captivates a rigid touch switch carrier.
Figure 6B:
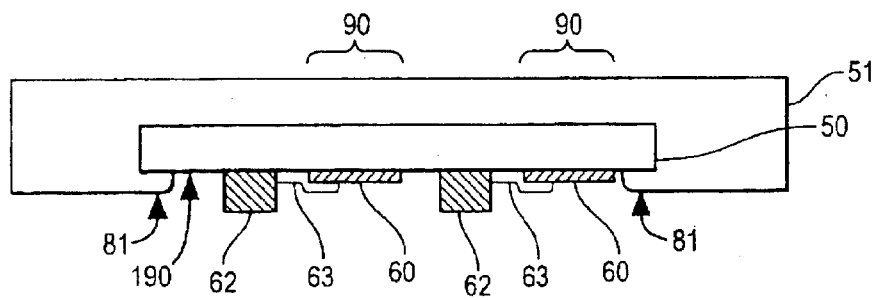
Figure 7A:
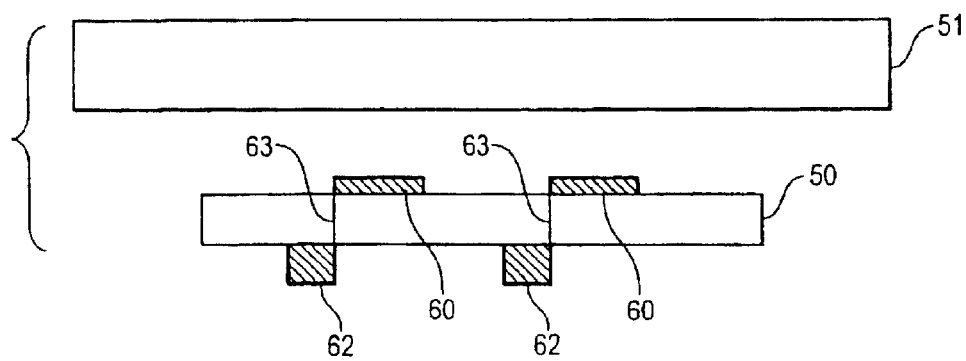
FIGS. 7A–7B show an integrated touch switch assembly having a thermoformable touch surface substrate that conforms to components mounted on a rigid touch switch carrier and both conforms to and captivates the rigid carrier.
Figure 7B:
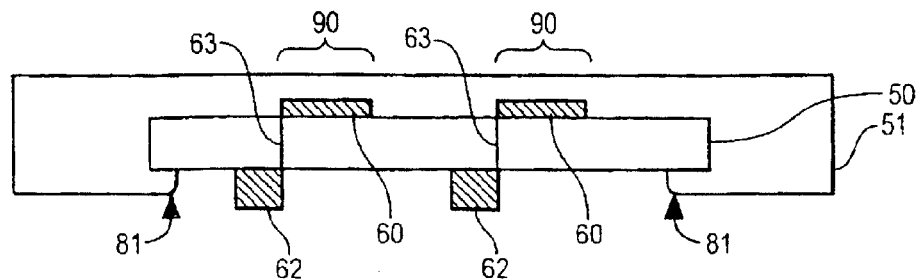

FIGS. 6A–7B illustrate embodiments wherein substrate 51 is thermoformed onto touch switch carrier 50. FIGS. 6A and 7A show the individual layers of the touch switch/control panel assemblies shown in FIGS. 6B and 7B, respectively, prior to assembly. In FIGS. 6A–6B, electrodes 60 and integrated control circuits 62 are shown on the same side 190 of touch switch carrier 50, whereas in FIGS. 7A–7B, electrodes 60 and integrated control circuits 62 are shown on opposite sides of touch switch carrier 50. In FIGS. 7A–7B, traces 63 electrically coupling integrated control circuits 62 to electrodes 60 extend through touch switch carrier 50. In this embodiment, traces 63 could be integral parts of touch switch carrier 50 or could be separate components inserted through cutout sections (not shown) of touch switch carrier 50. Other suitable techniques can be used to connect electrodes 60 with integrated control circuits 62 through touch switch carrier 50 without departing from the spirit of the invention.

The preferred placement of electrodes 60 depends on the application. One benefit of the placement of electrodes 60 as depicted in FIGS. 7A–7B is that electrodes 60 are completely sealed from the environment. Another is that the electrodes 60 are closer to touch surfaces 90 compared to the embodiment shown in FIGS. 6A–6B, yielding a stronger, more easily detected signal at the corresponding touch surface 90.

In both FIGS. 6B and 7B, thermoformable substrate 51 is shown thermoformed onto and over touch switch carrier 50 to create overlap 81, which helps to secure carrier 50 to substrate 51. In cases where carrier and substrate to be formed together do not bond well using thermoforming techniques or where they are otherwise not optimally compatible with each other, an insignificant air gap might exist between the carrier and substrate.

Figure 8A:
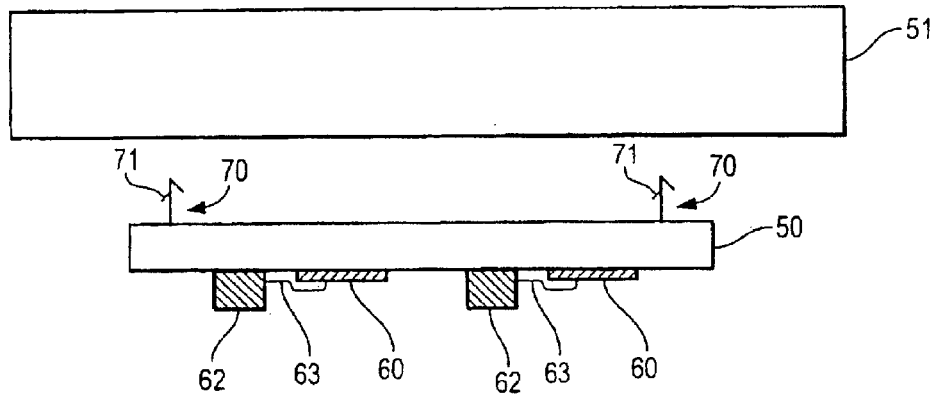
FIGS. 8A–8B show an integrated touch switch assembly having a thermoformable touch surface substrate that conforms to a touch switch carrier, wherein anchors secure the touch switch carrier to the touch surface substrate.
Figure 8B:
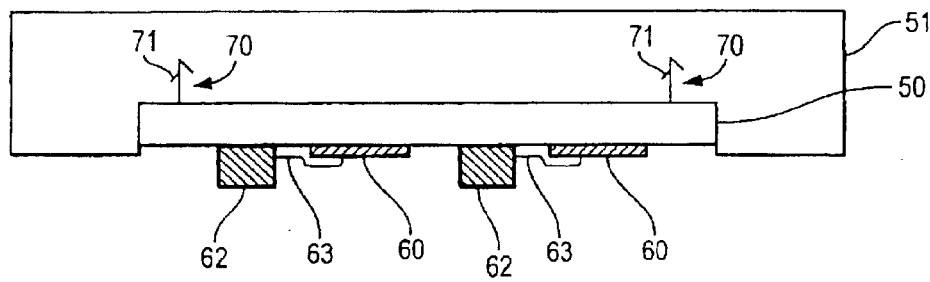
Figure 9A:
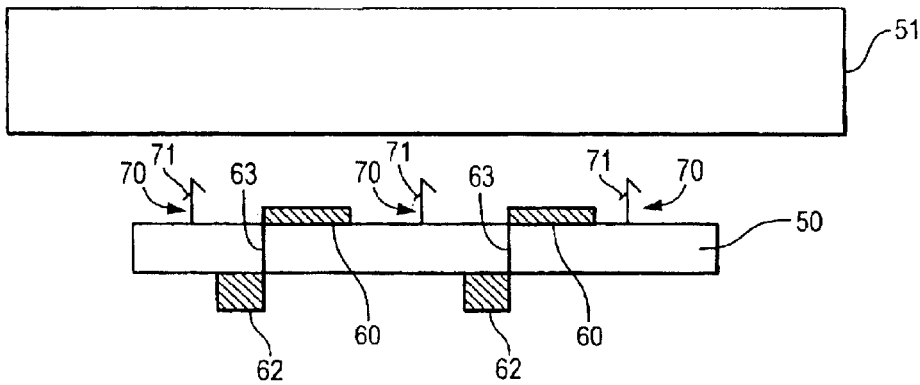
FIGS. 9A–9B show an integrated touch switch assembly having a thermoformable touch surface substrate that conforms to a touch switch carrier and components mounted thereon, wherein anchors secure the touch switch carrier to the touch surface substrate.
Figure 9B:
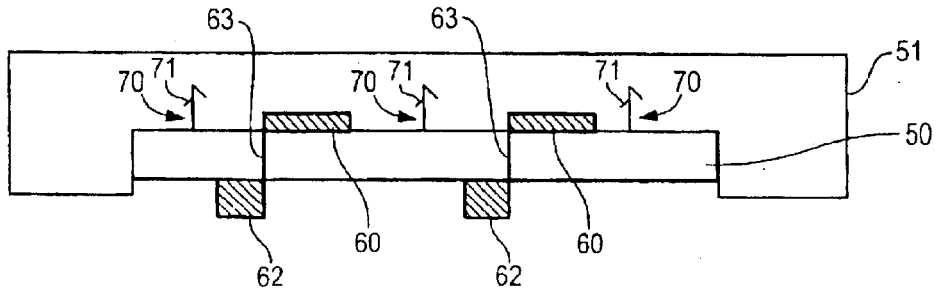

Another method of improving the attachment of thermoformable touch surface substrate 51 and touch switch carrier 50 is depicted in FIGS. 8A–9B, where mechanical anchors 70, borne on touch switch carrier 50, penetrate thermoformable substrate 51. This structure obviates the need for the overlap 81 of FIGS. 6A–7B, although both techniques could be used together to further enhance integration of carrier 50 with substrate 51. More particularly, FIGS. 8A and 9A show the layers of the touch switch assemblies shown in FIGS. 8B and 9B, respectively, prior to assembly. Anchors 70 are shown as narrow elements projecting from and substantially perpendicular to the touch switch carrier 50. Anchors 70 preferably include barbs 71 or other projections, as shown in FIGS. 8A–9B, or other structure, such as an angled branch or a buttonhead (not shown), that would help secure anchor 70 to substrate 51, as would be known to one skilled in the art. Anchors 70 can be configured in many other ways, as well.

Figure 10A:
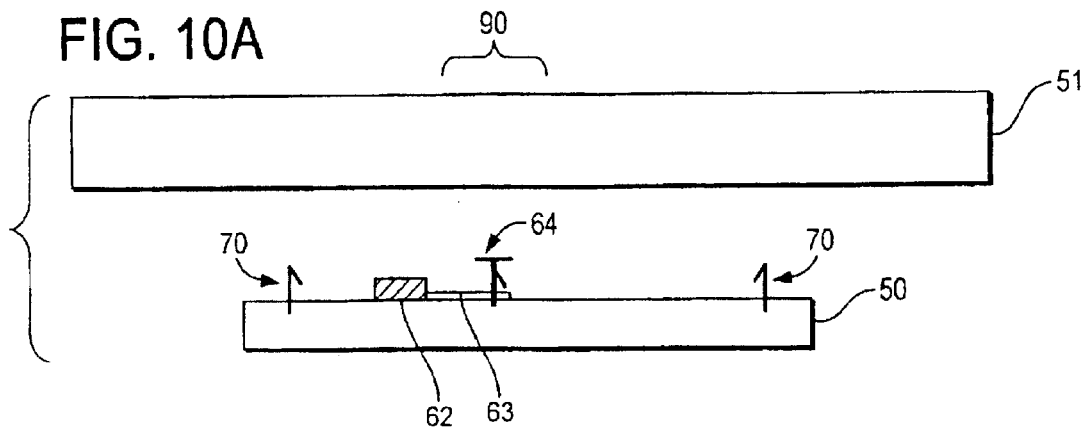
FIGS. 10A–10F show an integrated touch switch assembly with a thermoformable touch surface substrate that conforms to a rigid touch switch carrier and components disposed thereon, where certain ones of the components act as anchors securing the carrier to the substrate.
Figure 10B:
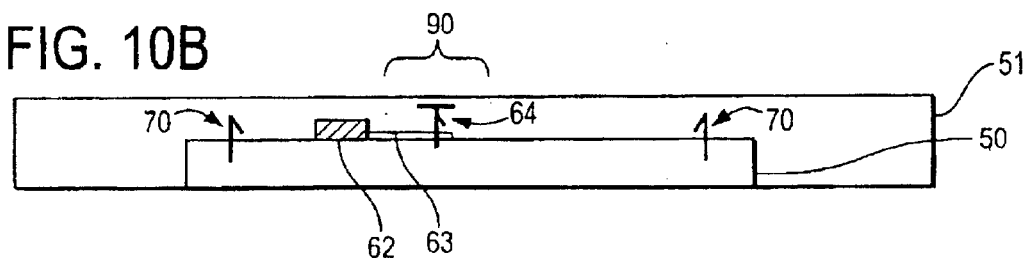
Figure 10C:
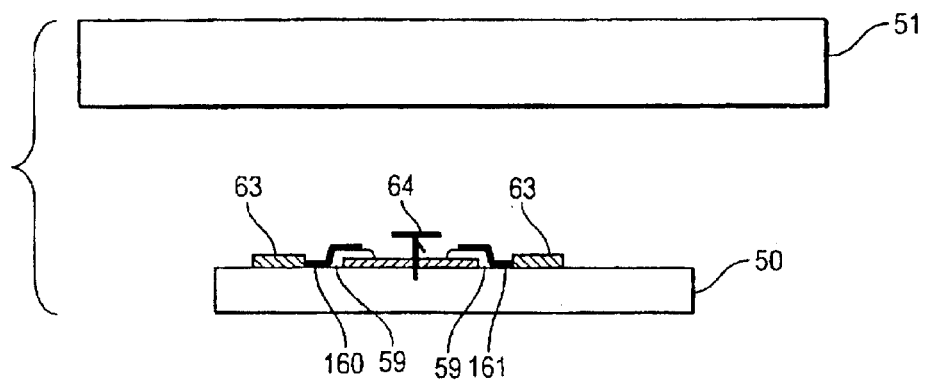
Figure 10D:
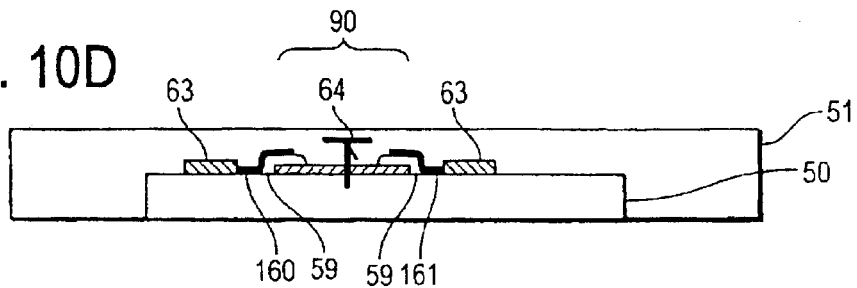
Figure 10E:
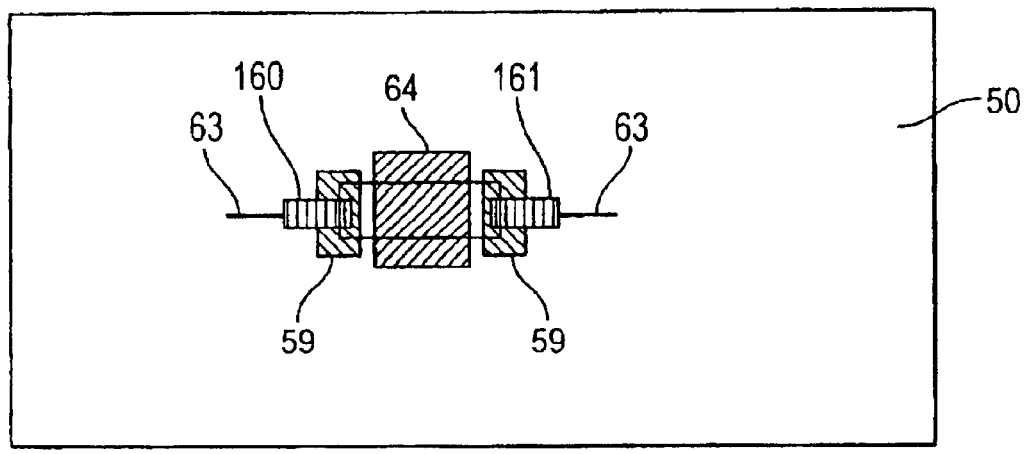
Figure 10F:
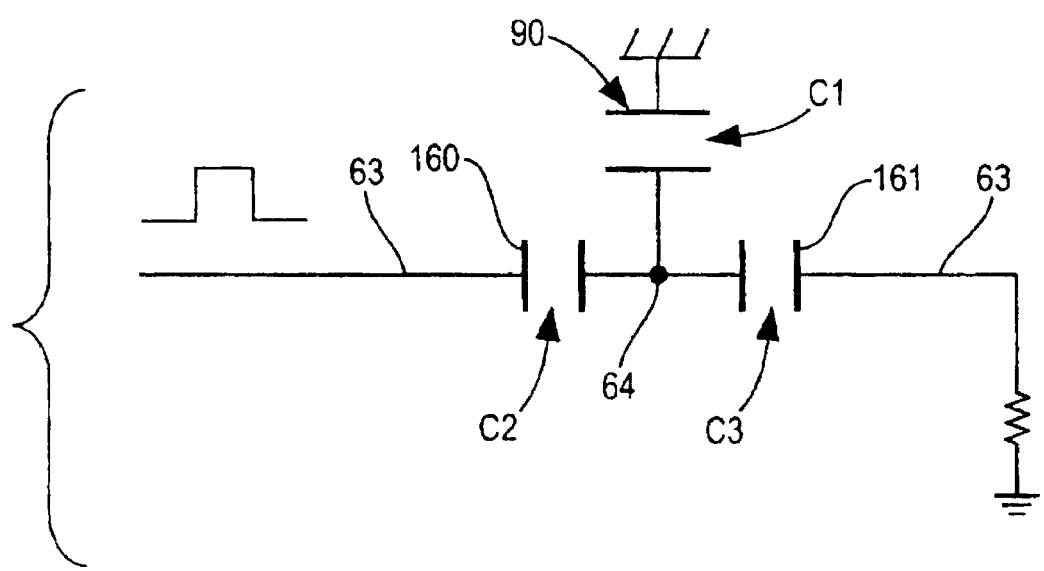

FIG. 10A shows the individual layers of the touch switch assembly shown in FIG. 10B, prior to assembly. This embodiment shows thermoformable substrate 51 attached to touch switch carrier 50 using electrodes 64 as anchors. Although this embodiment is shown as also including mechanical anchors 70, anchors 70 can be omitted. In addition to obviating the need for separate mechanical anchors, configuring electrodes as anchors as shown can place the touch sensor electrodes closer to corresponding touch surfaces 90, compared to other embodiments, thereby increasing the strength of the signal at the touch surfaces. In FIGS. 10A–10B, electrode anchors 64 are barbed to provide a more secure attachment between touch switch carrier 50 and thermoformable substrate 51. FIGS. 10C–10E illustrate another possible configuration for electrode anchors 64 of a capacitive touch sensor. FIG. 10C shows the separate layers of the integrated touch switch assembly of FIG. 10D, including thermoformable substrate 51 and touch switch carrier 50 having electrode anchor 64, shaped like a buttonhead, and electrodes 160 and 161, borne on touch switch carrier 50. Dielectric layers 59 can be provided to provide mechanical support for electrodes 160 and 161 during the thermoforming process. During the thermoforming process, thermoformable substrate 51 will flow around and conform to electrode anchor 64 and, when cooled will form part of a tight connection that can maintain and control the dimensional stability of the assembly. FIG. 10E shows a top view of the foregoing components borne on touch switch carrier 50 of FIG. 10C. The electrode anchors 64 of FIGS. 10A–10E can be any non-insulating material including, but not limited to, graphite, copper or conductive coated plastic. As with other mechanical anchors, electrode anchors 64 can reduce or eliminate the need for adhesives. FIG. 10F is a schematic representation of the capacitances C1, C2 and C3 between electrode 64 and touched surface 90 of FIG. 10D, electrode 160 and electrode 161, respectively, of the integrated touch switch of FIGS. 10C–10E.

The cross-sectional views of FIGS. 11A–13 illustrate an embodiment wherein the thermoforming process produces from thermoformable substrate 51 rivets 71 which penetrate touch switch carrier 50 through cutout sections 157 (a portion of which penetrate electrodes 60 in the illustrated embodiment) and secure touch switch carrier 50 and substrate 51 together. Cutout sections 157 could be of any shape or size and need not necessarily penetrate electrode 60. Overlap 81 further secures touch switch carrier 50 and substrate 51 together.

Figure 11A:
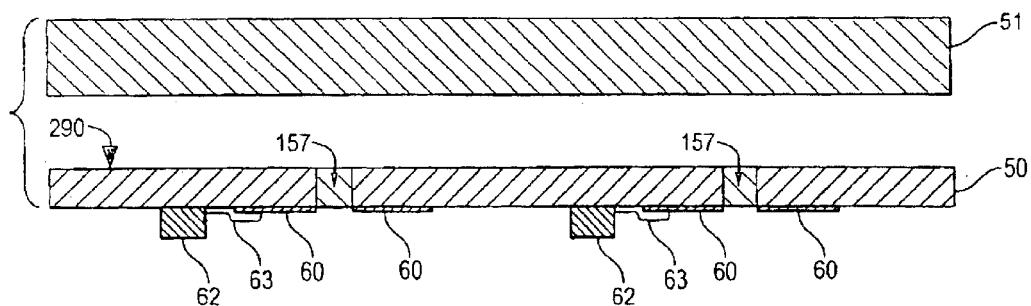
FIGS. 11A–11B show an integrated touch switch assembly having a thermoformable touch surface substrate that conforms to a rigid touch switch carrier, forming rivets that secure the carrier to the substrate.
Figure 11B:
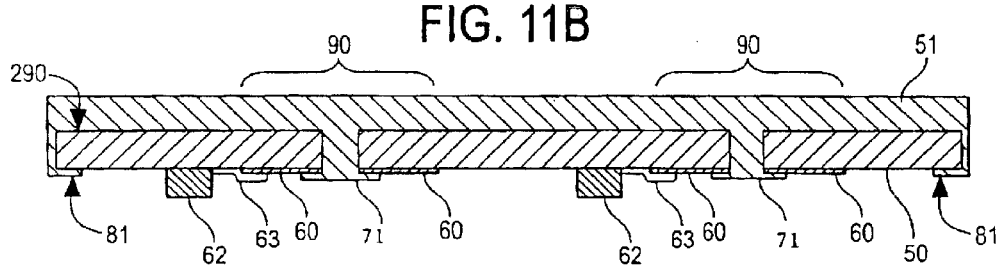
Figure 12A:
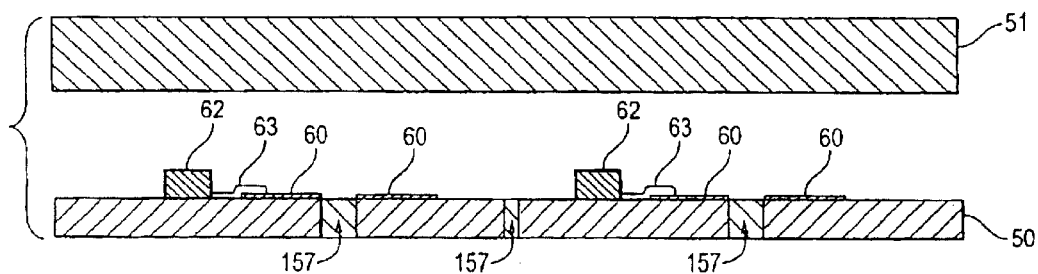
FIGS. 12A–12B show an integrated touch switch assembly having a thermoformable touch surface substrate that conforms to a rigid touch switch carrier and components disposed thereon, captivates the carrier, and forms rivets that secure the carrier to the substrate.
Figure 12B:
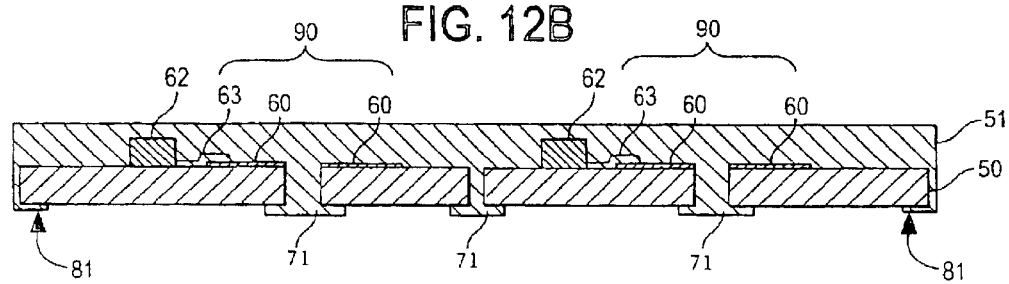
Figure 13:
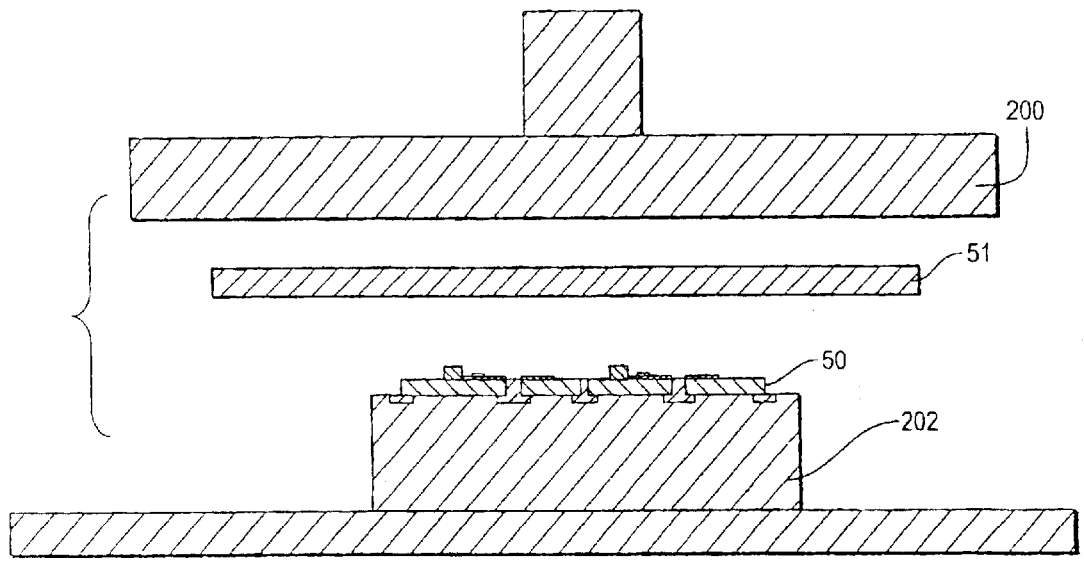
FIG. 13 shows certain aspects of the thermoforming process.

FIGS. 11A and 12A show the separate layers of the touch switch/control panel assembly shown in FIGS. 11B and 12B, respectively, prior to assembly. In FIGS. 11A–11B, substrate 51 is thermoformed to the non-component bearing side 290 of touch switch carrier 50. In FIGS. 12A–12B, substrate 51 is thermoformed to the component bearing side 190 of touch switch carrier 50. In both FIGS. 11B and 12B, each rivet 71 is shown penetrating electrode 60. In other embodiments, rivets 71 could be formed in any location along touch switch carrier 50, depending on the requirements of the particular application. The configurations of FIGS. 11A–12B are advantageous, however, in that rivets 71 help ensure that the desired separation between touch surfaces 90 and electrodes 60 is achieved and maintained. When rivets 71 cool or pressure is relieved following the thermoforming process, a mechanical bond secures touch switch carrier 50 to substrate 51, without the need for separate mechanical bond assemblies. FIG. 13 shows a press/mold apparatus, including platen 200 and mold 202, which could be used to fabricate the assemblies shown in FIGS. 11A–12B.

All of the drawings described in detail above depict rigid touch switch carriers. As explained above, the embodiments of the present invention corresponding to these drawings could instead employ flexible or thermoformable touch switch carriers. Use of flexible or thermoformable touch switch carriers has particular advantages, some of which will be described below with reference to FIGS. 14A–18D.

Figure 14A:
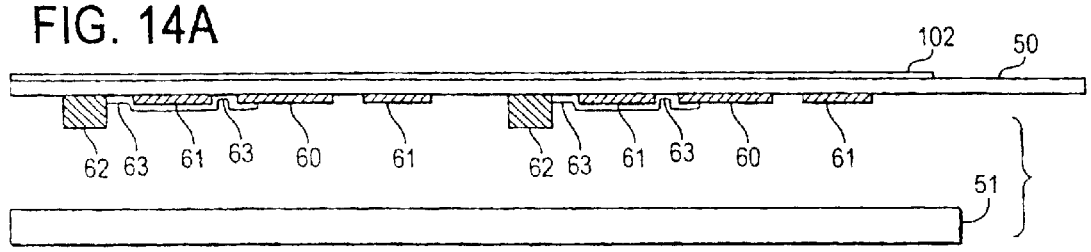
FIGS. 14A–14B show an integrated touch switch assembly having a thermoformable substrate that conforms to components mounted on a carrier comprising a decorated substrate.
Figure 14B:
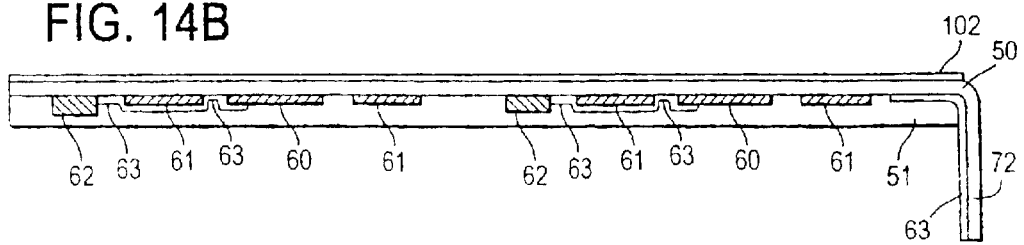
Figure 14C:
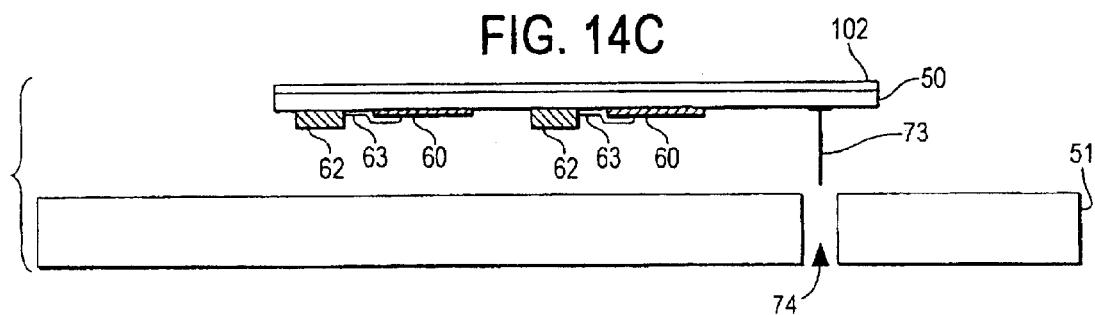
FIGS. 14C–14F show an integrated touch switch assembly having a thermoformable substrate that conforms to a decorated substrate and components mounted thereon.
Figure 14D:
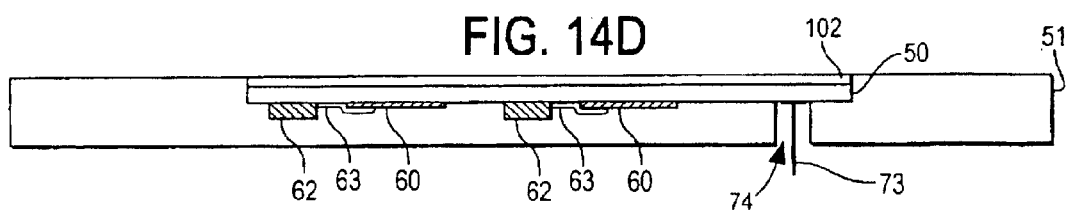
Figure 14E:
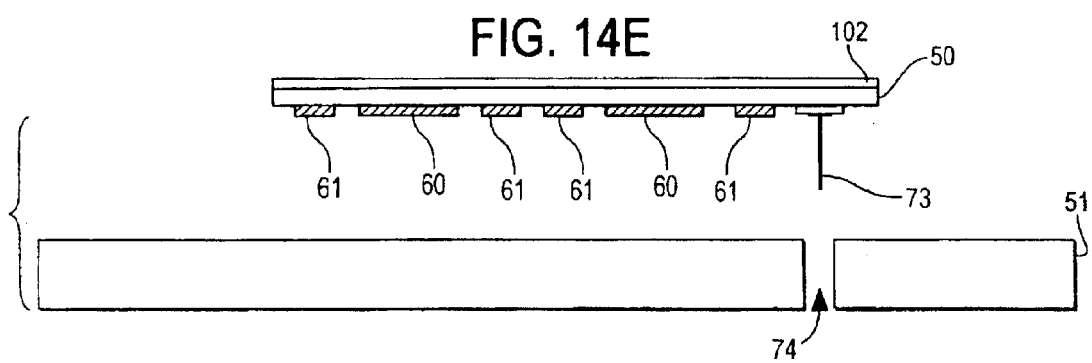
Figure 14F:
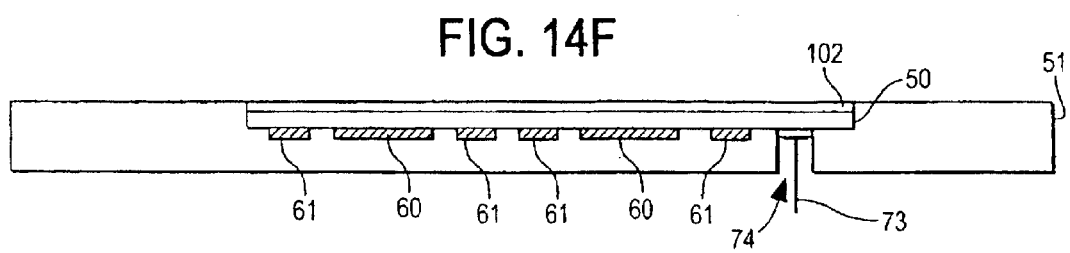

FIGS. 14A, 14C and 14E show the separate layers of the touch switch assemblies shown in FIGS. 14B, 14D and 14F, respectively, prior to assembly. FIG. 14A illustrates a flexible touch switch carrier 50 having decorative layer 102 disposed thereon according to the invention described in U.S. Provisional Patent Application No. 60/341,551 and related U.S. patent application Ser. No. 10/272,047, entitled Touch Sensor with Integrated Decoration, filed on Oct. 15, 2002. The integrated touch switch/control panel assembly of FIG. 14B includes flexible tail 72 which is a part of flexible touch switch carrier 50 that has not been secured directly to thermoformable substrate 51. Flexible tail 72 can include circuit traces 63 and could prove advantageous for providing a connection to signal or power sources or ground, or could lead circuit traces 63 to control circuits that are not integrated with or proximate the various components of the particular touch switch. Flexible tail 72 could also be useful for removing the thermoformed touch switch/control panel assembly from its mold. Flexible tail 72 is especially advantageous in that it can wrap around obstacles and obstructions and can be connected underneath substrate 51.

Likewise in some respects, FIGS. 14C–14D show an integrated touch switch/control panel assembly with decorative layer 102 and connector 73, which could serve the same or similar electrical functions as described above with respect to flexible tail 72. Connector 73 is shown accommodated by cut out section 74 of thermoformable substrate 51. Alternatively, connector 73 could be attached to touch switch carrier 50 and orientated in any configuration depending on the design of the particular touch switch and the application. Connector 73 is advantageous where touch switch carrier substrate 50 is rigid, although a flex tail (not shown) could be attached to a rigid carrier 50 such that the advantageous of both a rigid carrier and flexible tail connection are present. FIGS. 14E–14F show the same principle of the present invention as depicted in FIGS. 14C–14D but with capacitive touch switches and their components. Both flexible tail 72 and connector 73 could connect electrodes 60, 61 to, for example, a control circuit which is not proximate the touch switch.

As shown in FIGS. 15A–18D, integrated touch switch/control panel assemblies can be shaped during the thermoforming process. These drawings depict certain advantageous configurations of the integrated touch switch/control panel assemblies, but the integrated touch switch/control panel assemblies of the present invention could be formed into other configurations as required by the particular application. The thermoformable substrates 51 of FIGS. 4A–18D also could advantageously be components of a structure, such as a door panel, to be integrated into a separate apparatus or assembly, such as a car, that ordinarily include thermoformed components. The corresponding touch switches then would be integral features of the final apparatus or assembly.

Any embodiment of the present invention can be used to integrate a touch switch assembly into a component of another assembly. The principles of the present invention described with reference to FIGS. 15A–18D, which illustrate shaped touch switch/control panel assemblies made using thermoforming techniques, can prove particularly useful when touch switch assemblies are integrated into components of more complex assemblies. This is because touch switches that are integrated into control panels comprising such components, such as door panels, might ordinarily be difficult for a user to locate without diverting attention from another task, such as driving. The principles of the present invention discussed with reference to FIGS. 15A–18D can alleviate this difficulty by providing tactile feedback to a user who thus can be alerted to the location of an operative touch surface by the shape of the component itself.

Integrating a touch switch into a product component as described above obviates the need for a separate control panel which would then need to be incorporated into the product. This is particularly useful where numerous control panels might clutter an interface space, such as a car's dashboard and/or console. Eliminating the need for separate panels could also eliminate certain design limitations, freeing the designer and manufacturer of the final apparatus or assembly to streamline the design of the interface space, minimize distractions, offer easier cleaning and reduce the cost and complexity of the assembly process.

Figure 15A:
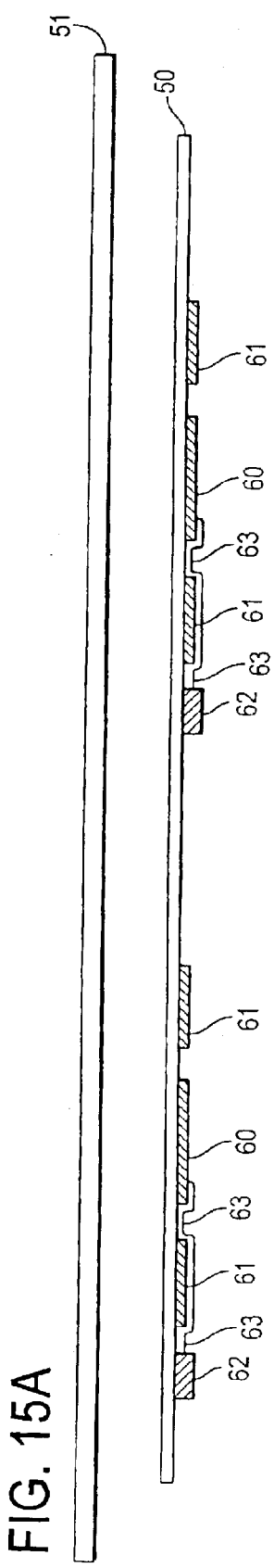
FIGS. 15A–15D show an integrated touch switch assembly having surface depressions defining touch surfaces and a thermoformable touch surface substrate attached to a thermoformable carrier.
Figure 15B:
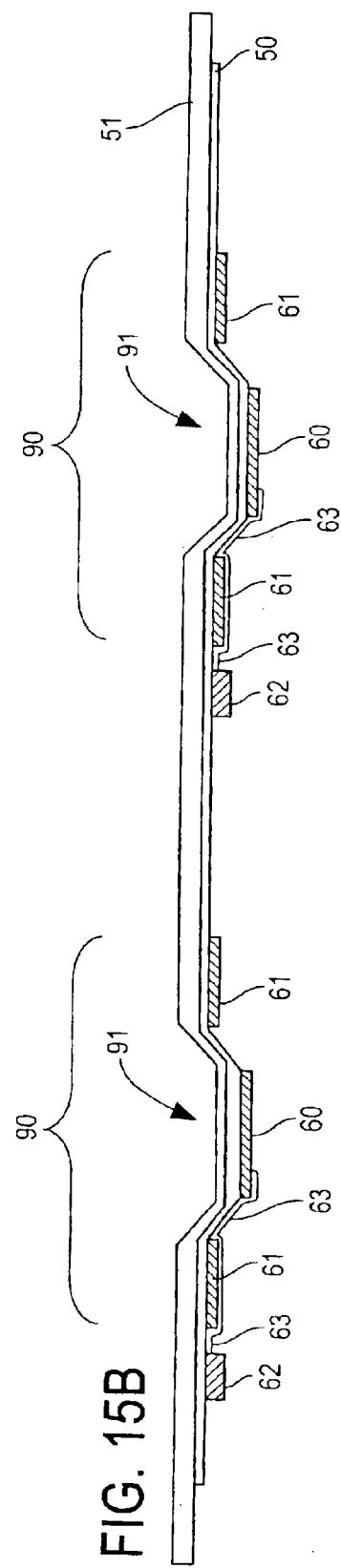
Figure 15C:
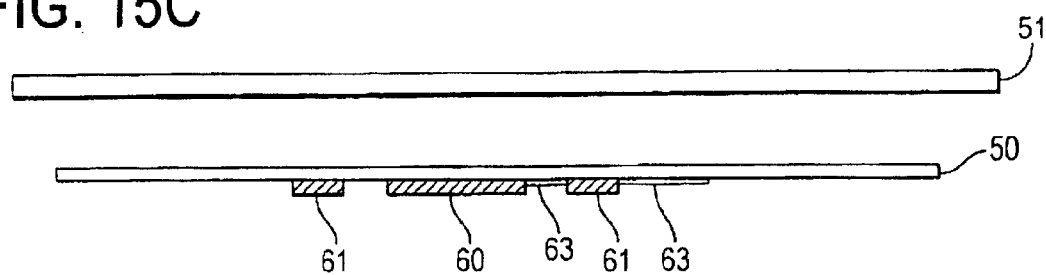
Figure 15D:
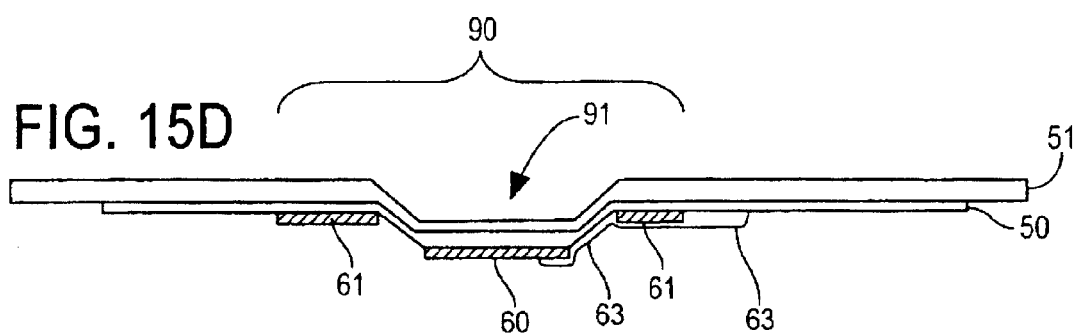

FIGS. 15A and 15C show the separate layers of the touch switch/control panel assemblies shown in FIGS. 15B and 15D, respectively, prior to assembly. FIG. 15A shows a touch surface substrate 51 and a touch switch carrier 50 bearing two touch switches, each including an inner electrode 60, an outer electrode 61, an integrated control circuit 62 and traces 63 connecting these components. FIG. 15C is similar, except that it depicts a single capacitive touch switch, which does not include an integrated control circuit. Touch surface substrate 51 and touch switch carrier 50 are integrated together and molded by a thermoforming process according to the present invention to yield the touch switch/control panel assemblies shown in FIGS. 15B and 15D. These assemblies, as illustrated, include a depression 91 about each touch surface 90, although the invention can be practiced so as to yield a depression 91 about less than all of the touch surfaces 90 on the assembly. Depression 91 can serve to alert the user to the presence of touch surface 90. This design allows the user to tactilely locate a touch surface by locating depression 91 without inadvertently triggering the touch switch.

These embodiments are well-suited for use in connection with differential sensing techniques which can minimize the occurrence of unintended triggering. To this end, inner electrode 60 and outer electrode 61 can be connected to a differential control circuit to interpret the differential control circuit inputs resulting from disturbances to the electric fields about the two electrodes. The differential control circuit can be configured such that the touch switch is triggered only when inner electrode 60 alone is touch-stimulated, and is not triggered when a touch stimulus is applied to either outer electrode 61 alone or to both inner electrode 60 and outer electrode 61 substantially equally. This embodiment might have particular value in, for example, an automotive application wherein touch switches are integrated into a console which might also function as an armrest. If an arm were to cover an entire touch switch at once, the touch switch would not be triggered because the appendage would stimulate both the inner and outer electrodes simultaneously. Alternatively, because the interface geometry, due to depression 91, places inner electrode 60 farther from the arm than outer electrode 61 when the arm covers the entire touch switch, the arm would stimulate the electric field about outer electrode 61 to a greater degree than the electric field about inner electrode 60 and thus would not trigger the touch switch. Thus, this and similar touch switch configurations can prevent unintended switch actuations. Similar benefits can be achieved by making substrate 51 relatively thick in the region over electrode 60 compared to the region over electrode 61. This configuration (not shown) would require a relatively precisely aimed or clearly intended stimulus in order to trigger a touch switch.

FIGS. 16A–18D illustrate embodiments further including ridges 92 about each touch surface 90. Ridges 92 increase the user's ability to tactilely or visually locate the presence of operative touch surfaces 90, without inadvertently triggering the touch switch. These drawings also demonstrate that inner and outer electrodes 60 and 61 can assume any shape required by the application or dictates of the design.

Figure 17A:
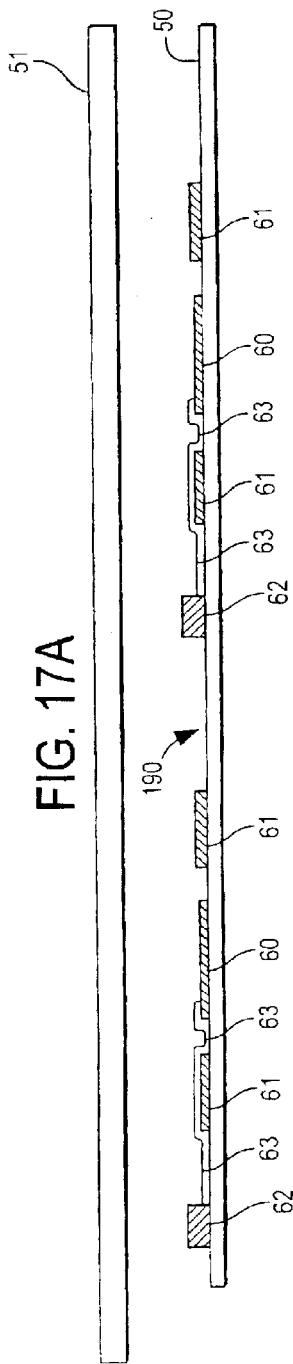
FIGS. 17A–17C show an integrated touch switch assembly similar to that shown in FIGS. 16A–16F wherein the thermoformable touch surface substrate conforms to the touch switch components disposed on the touch switch carrier.
Figure 17B:
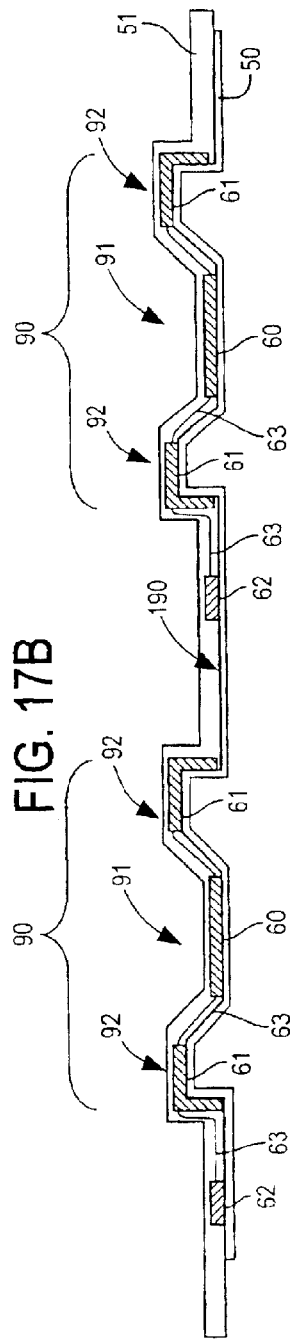
Figure 17C:
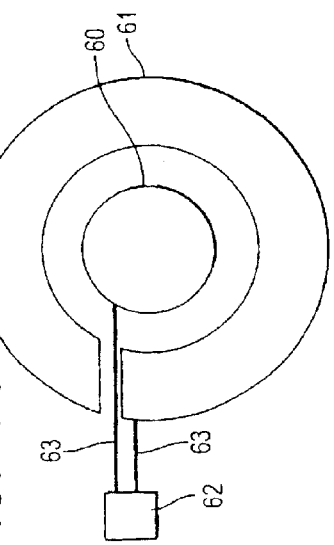
Figure 18A:
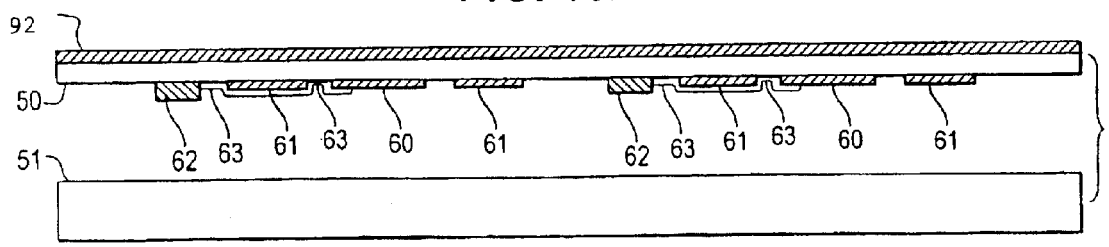
FIGS. 18A–18D show an integrated touch switch assembly similar to that shown in FIGS. 15A–15D with a decorated thermoformable substrate as the touch surface and further including raised areas defining touch surfaces.
Figure 18B:
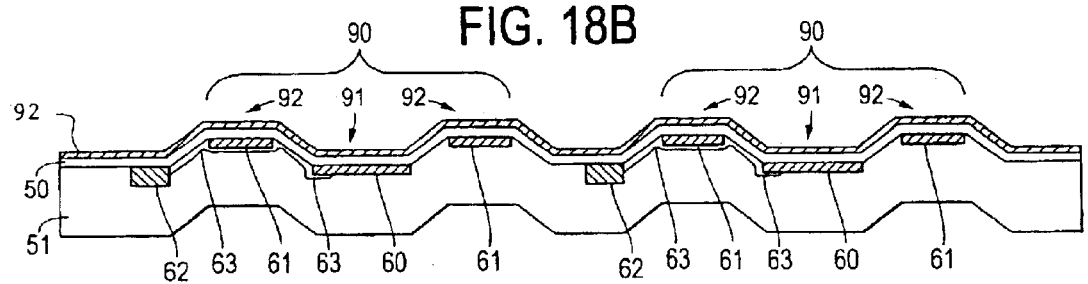
Figure 18C:
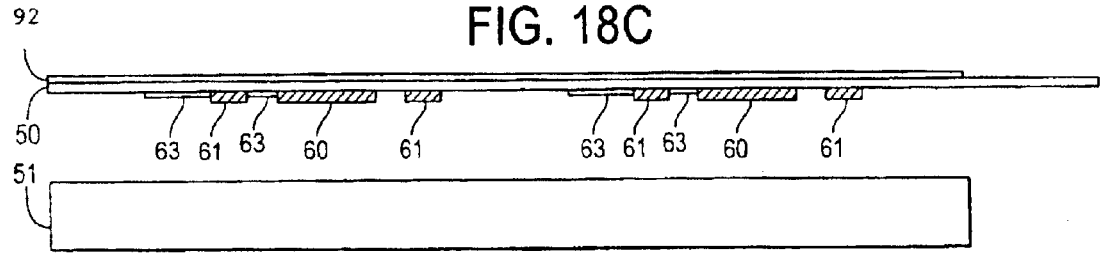
Figure 18D:
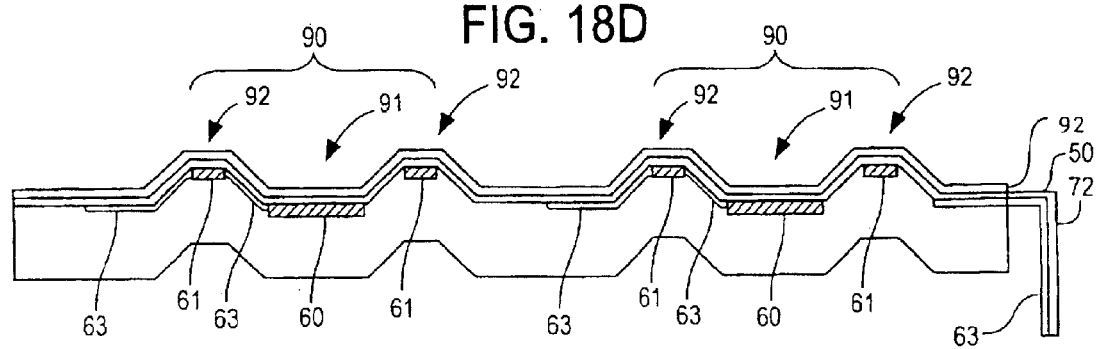

FIGS. 16A, 16D, 17A, 18A and 18C show the separate layers of the touch switch/control panel assemblies shown in FIGS. 16B, 16E, 17B, 18B and 18D, respectively, prior to assembly. FIG. 16C depicts a touch sensor with integrated control circuit 62 having circular electrodes 60 and 61, while FIG. 16F depicts a capacitive touch sensor having rectangular electrodes 60 and 61. FIGS. 17A–17C differ from FIGS. 16A–16C in that substrate 51 in FIGS. 17A–17C conforms to the components on component bearing side 190 of touch switch carrier 50. This configuration can minimize the distance between touch surface 90, and more specifically the portions of touch surface 90, and inner electrode 60 and can also seal electrodes 60 and 61, traces 63 and integrated control circuit 62 from the environment. FIGS. 18A–18D illustrate embodiments of the present invention wherein touch switch carrier 50 includes decorative layer 102 having touch surfaces 90 marked thereon, and where the integrated and shaped touch switches can therefore be thermoformed onto a thicker substrate 51. FIGS. 18A–18B illustrate an embodiment using touch switches having electrodes 60, 61 and an integrated control circuit, whereas FIGS. 18C–18D illustrate an embodiment using capacitive touch switches having electrodes 60, 61 without a local control circuit. FIGS. 18C–18D further illustrate flexible tail 72 which could be used to connect electrodes to a remote control circuit, though the invention could be practiced without flexible tail 72.

In any of the preceding embodiments, thermoformable substrate 51 could assume any of various configurations depending on the requirements of the design or application. For instance, thermoformable substrate 51 could have any combination of flat and curved surfaces.

In FIGS. 19–26, the principles of the present invention are applied to integrated touch switch/control panel assemblies created using injection molding techniques. The injection molding can occur under any of various temperature and pressure conditions, depending on the characteristics of the molded material and design and application requirements. The molded material can be any suitable material, including plastic, and the final form of the integrated touch switch assembly is determined by the configuration of the mold or molds into which the material is injected.

The integrated touch switch assemblies of FIGS. 19–26 include molded touch surface substrates 151 integrated with touch switch carriers 50. Each carrier 50 includes two touch switches, each including electrodes 60, 61, integrated control circuit 62, and traces 63. FIGS. 19–22 illustrate embodiments including flexible touch switch carriers 50 and flexible tails 72, while FIGS. 23–26 illustrate embodiments including rigid touch switch carriers 50 and connectors 73. these configurations, with its utility depending primarily on the properties of touch switch carrier 50 and molded substrate 151. Alternatively, other or additional supplemental attachment methods could be used, including rivets or anchors.

Figure 19:
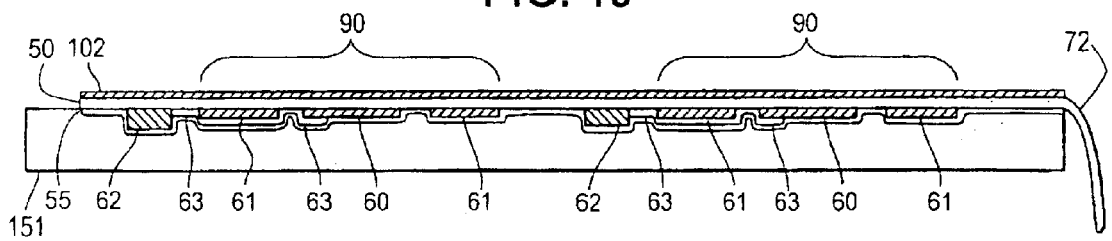
Figure 20:
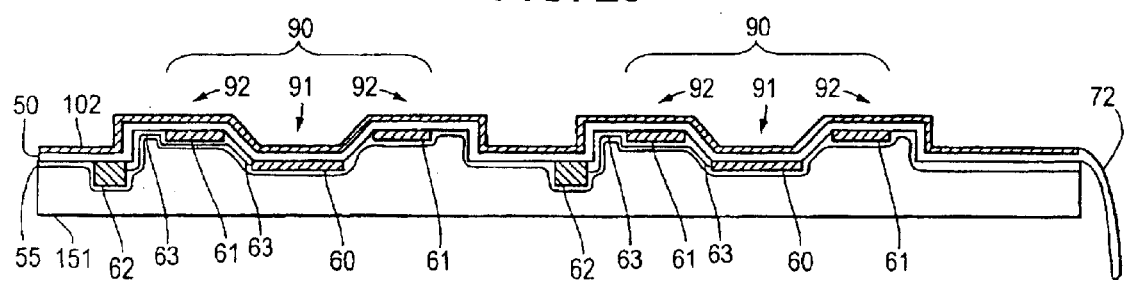

The embodiments of FIGS. 19–20 include decorative layer 102 defining touch surfaces 90 disposed on touch switch carrier 50, with molded substrate 151 providing support. Alternatively, touch switch carrier 50 could be decorated directly, obviating the need for a separate decorative layer. The integrated touch switch of FIG. 20 is of similar construction as that shown in FIG. 19, but is shaped according to the principles of the present invention to include depressions 91 and ridges 92 about touch surfaces 90.

Figure 21:
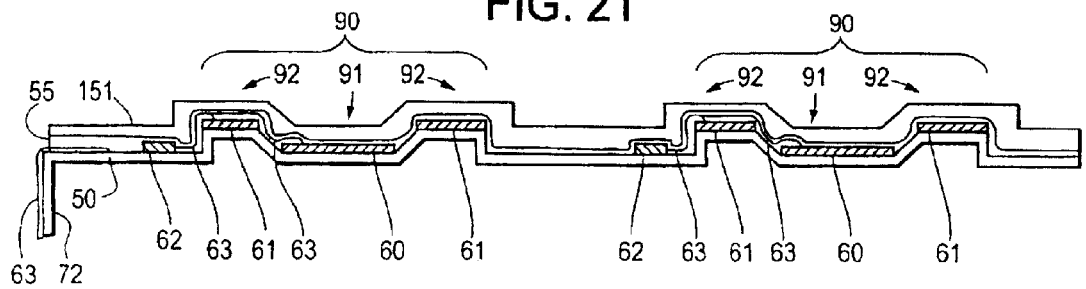
Figure 22:
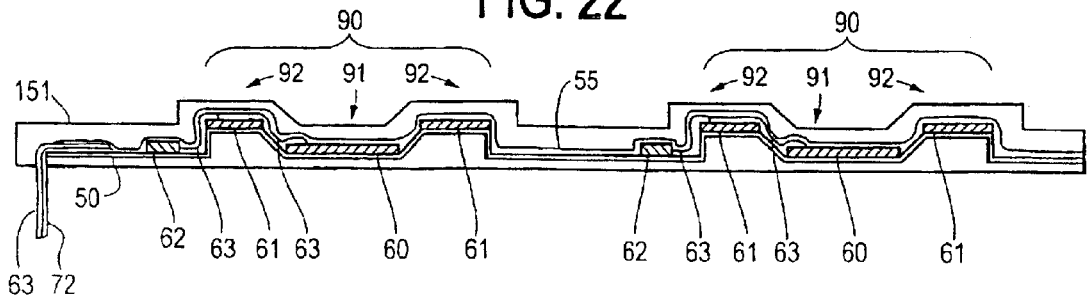

FIG. 21 shows an integrated and shaped touch switch assembly with molded substrate 151. FIG. 22 shows the integrated and shaped touch switch assembly of FIG. 21 where molded substrate 151 substantially surrounds touch switch carrier 50, thereby protecting the touch sensor components from adverse external environmental conditions, such as moisture, chemicals, and the like. In both of these embodiments, substrate 151 is molded to yield depressions 91 and ridges 92 about touch surfaces 90, which correspond to the underlying touch switches. In alternate embodiments, depressions 91 and/or ridges 92 could be omitted.

FIGS. 23–26 show various embodiments of the present invention wherein integrated touch switch/control panel assemblies are fabricated using injection molding techniques. In FIG. 23, depicting a configuration equally amenable to the thermoforming process in certain aspects, touch switch carrier 50 is a printed circuit board including anchors 70. Molded substrate 151 is secured to touch switch carrier 50 by adhesive layer 55, anchors 70 and overlaps 81, with touch surfaces 90 indicated by depressions 91. In FIG. 24, touch switch carrier 50 is shown with molded substrate 151 molded onto the non-component bearing side 290 of touch switch carrier 50. In FIG. 25, aspects of FIGS. 23 and 24 are combined so that the touch switch depicted involves depressions 91 and molded substrate 151 molded onto the non-component bearing side 290 of touch switch carrier 50. In FIG. 26 molded substrate 151 is shown substantially surrounding touch switch carrier 50, thus potentially obviating the need for anchors 70.

Figure 30:
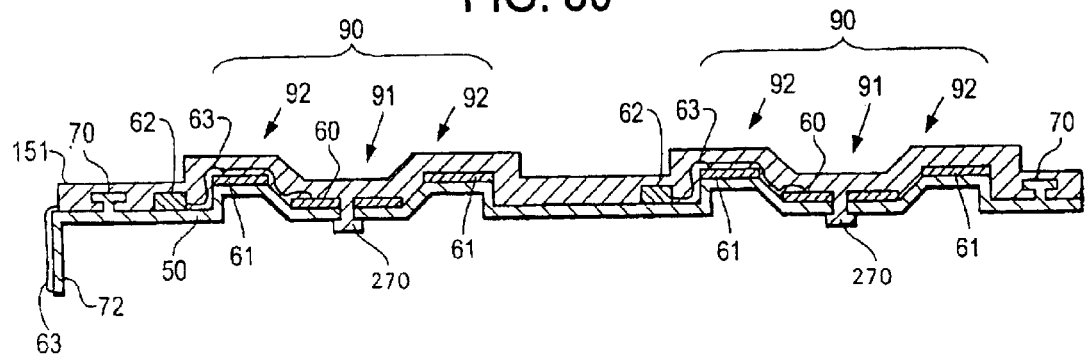
FIGS. 30–31 show integrated touch switch assemblies embodying principles of the present invention as depicted in FIGS. 12A–12B and 17A–17B.
Figure 31:
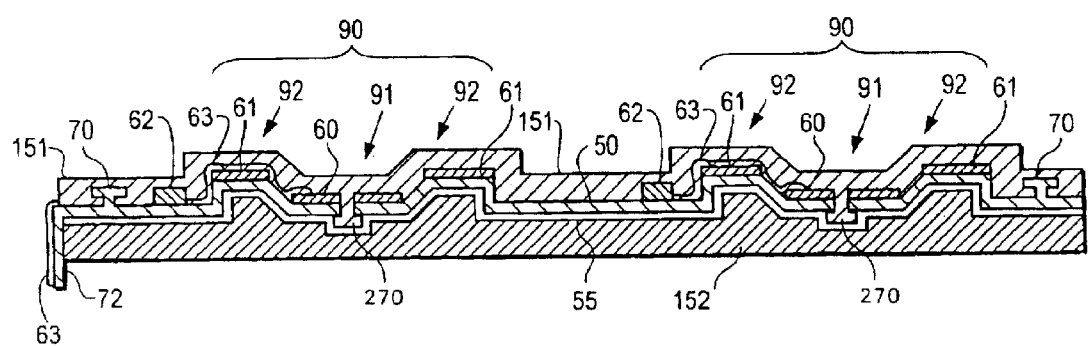

FIGS. 30–31 show rivets 71 penetrating touch switch carrier 50, including electrodes 60, to secure flexible touch switch carrier 50 to molded substrate 151, which defines touch surface 90. In other embodiments, rivets 71 need not penetrate electrodes 60. In FIG. 31, the integrated touch switch/control panel assembly of FIG. 30 is shown affixed by an adhesive layer 55 to an additional substrate 152, which can be applied in a manner in accordance with the present invention or otherwise and which can provide rigidity to the integrated touch switch/control panel assembly of FIG. 30. The integrated touch switch assemblies of both FIGS. 30 and 31 show the use of anchors 70, in this case resembling buttonheads, as well. The embodiments depicted in FIGS. 30–31 could be created using either injection molding or thermoforming techniques, but injection molding techniques could prove more advantageous in that they can completely encapsulate the touch sensor components and seal them from environmental conditions.

FIGS. 27–29 and 32–34 depict another embodiment of the present invention involving the use of compliant touch surface substrates to provide tactile and other feedback to the user. Compliant touch surface substrates can conform to the user's touch, informing the user that an operative touch surface has been located. Touch switches with compliant touch surface substrates also could be configured to require a certain minimum amount of depression of the compliant touch surface substrate before the touch switch is triggered. A touch switch/control panel assembly configured in this manner desirably provides the tactile feedback associated with the operation of a mechanical switch.

Figure 27:
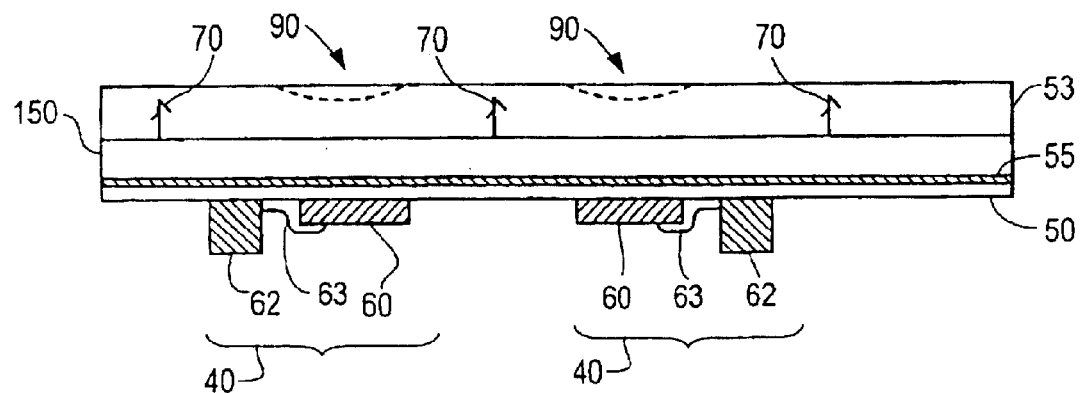
FIGS. 27–29 show integrated touch switch assemblies having compliant touch surface substrates that provide tactile feedback similar to that associated with mechanical switches.

In FIG. 27, compliant substrate 53 is shown as generally overlaying touch switch carrier including touch switches 40, and therefore defining touch surface 90. Compliant substrate 53 can be thermoformable, injection molded or otherwise attached to any touch switch assembly, including integrated touch switch assemblies according to the present invention. Where compliant substrate 53 is formed by thermoforming or injection molding, compliant substrate 53 can be any suitable material, including plastic. Where compliant substrate 53 is not formed by thermoforming or injection molding techniques, compliant substrate 53 could be composed of leather, vinyl, rubber, foam, plastic or any other compliant material, and could be attached to any embodiment of the integrated touch switch/control panel assemblies described herein using known techniques, including adhesive techniques. The compliant material could also be an overlay, such as those used in conventional membrane switches utilizing preformed domes, dome switches and other similar structures. Touch surfaces 90 could be indicated by texture created during the forming process or otherwise, by depressions or ridges created during the forming process or otherwise or by decorative layers, which themselves could include textured areas, or in any other manner according to the requirements of the particular application.

Figure 28:
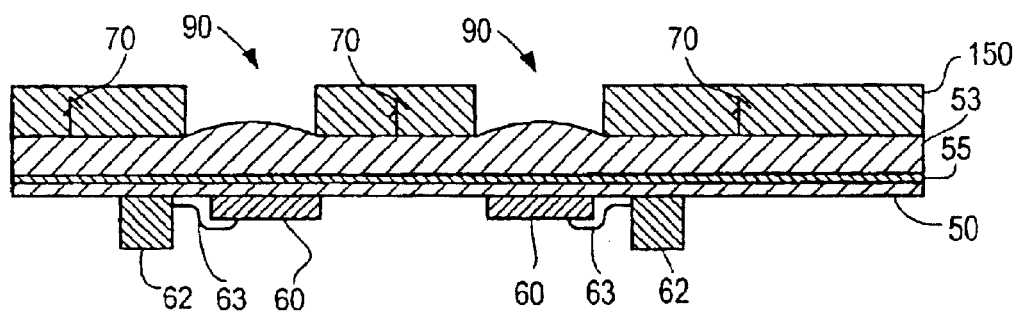
Figure 29:
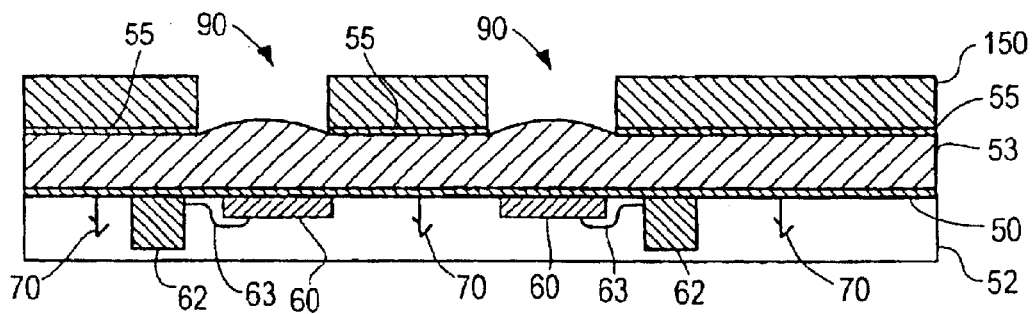

In FIGS. 28–29, compliant substrate 53 is shown sandwiched between touch switch carrier 50 and a third substrate 150 composed of any suitable material. In FIG. 28, for instance, substrate 51 could be thermoformable or injection molded and could also be penetrated by anchors 70 connected either to touch switch carrier 50 or compliant substrate 53. A variety of configurations and assembly techniques are possible for this embodiment. For instance, with reference to FIG. 29, touch switch carrier 50 could be a printed circuit board and could include mechanical attachment devices which become thermoformed to substrate 52 as a subassembly to be molded to compliant substrate 53 and substrate 150 in a two-step co-injection process. In FIG. 29, substrate 52 seals the components of the touch switch assembly and is penetrated by anchors 70 borne on touch switch carrier 50. Substrate 150 of FIG. 29 could therefore be attached to compliant material 53 using either adhesive layer 55 or by thermoforming or molding techniques or by a combination of the two. Substrate 150 preferably involves apertures aligned with operative touch surfaces 90, to allow a user to touch complaint substrate 53.

Figure 32:
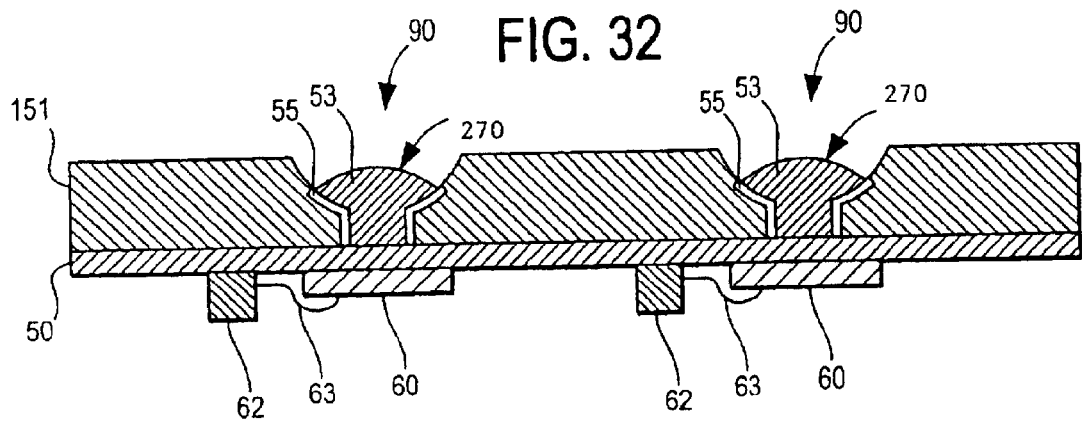
FIGS. 32–34 show integrated touch switch assemblies having rivets formed of a compliant substrate and integrated in various ways into the touch switch assembly.

In FIG. 32, compliant substrate 53 is formed into areas of molded substrate 151 to form rivets 71 that can provide the tactile advantages of a mechanical switch. Compliant substrate 53 can be added by co-injection techniques, by selective dispensing, or by ultrasonic welding and can include the use of adhesives to bond compliant substrate 53 to substrate 151. Although substrate 151 is shown as injection molded, substrate 151 could also be thermoformed or preformed to accommodate the various structures of the embodiments of the present invention, including rivets 71.

Figure 33:
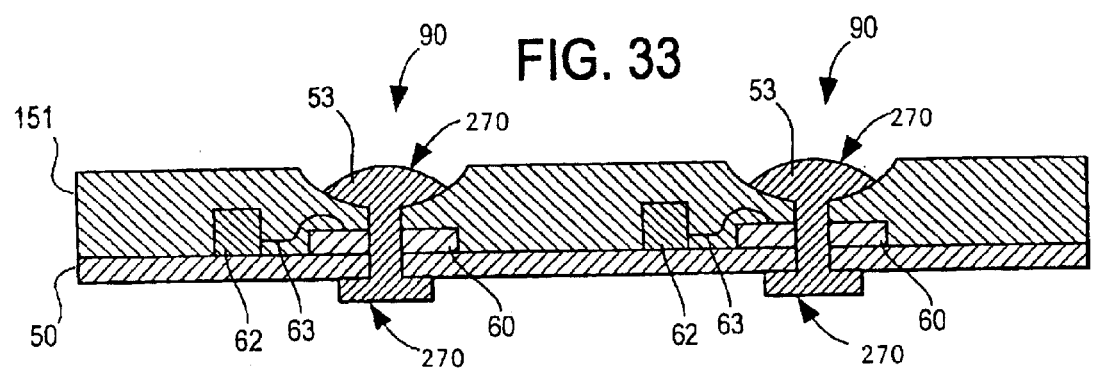
Figure 34:
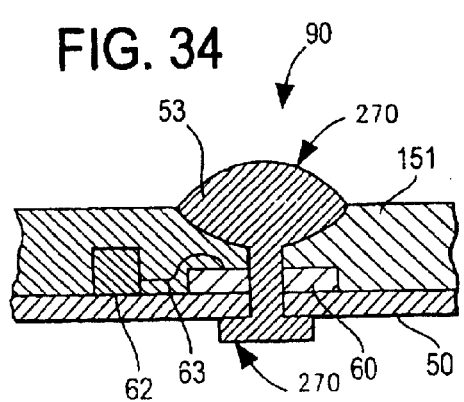

In FIGS. 33–34, compliant material 53 forms rivets 71 that penetrate both substrate 51 and touch switch carrier 50, as well as touch switch electrode component 60. The need for adhesives thereby can be reduced or eliminated altogether. While both thermoforming and molding techniques could be used to create the embodiments of the present invention depicted in FIGS. 32–34, molding techniques are preferred. Various other configurations of compliant material 53 are compatible with the present invention and can vary according to the requirements of the particular touch switch or application for which the touch switch will be used.

FIGS. 35–41 show the principles of the present invention used to create bezels and housings for both ordinary touch switches and integrated touch switch/control panel assemblies, as well as for inventive touch switches otherwise integrated according to the present invention. The bezels and housings depicted can provide an ergonomic control panel for a touch switch user, can provide strength and support to a touch switch carrier substrate and can facilitate the integration of a touch switch control panel with other components of a larger assembly, such as an automobile's interior, as can be seen by those skilled in the art. FIGS. 35–41 depict various ways to create the bezels and housings to ensure a secure attachment of touch switch carrier 50 to substrate 151.

Figure 35:
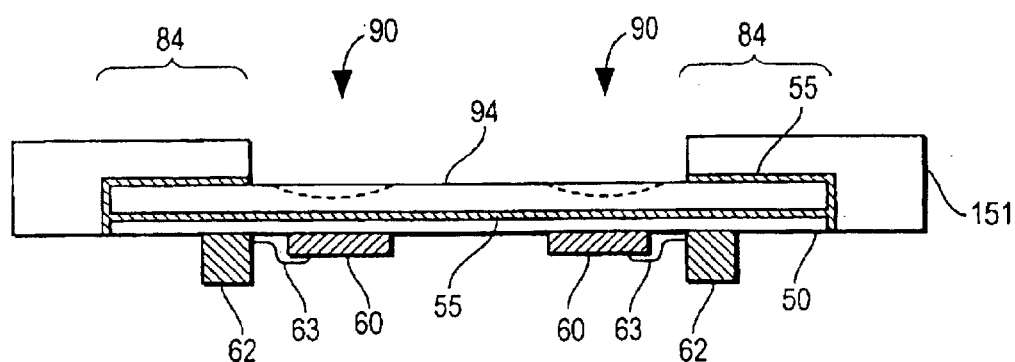
FIGS. 35–41 show integrated touch switch assemblies having bezels and frames.
Figure 36:
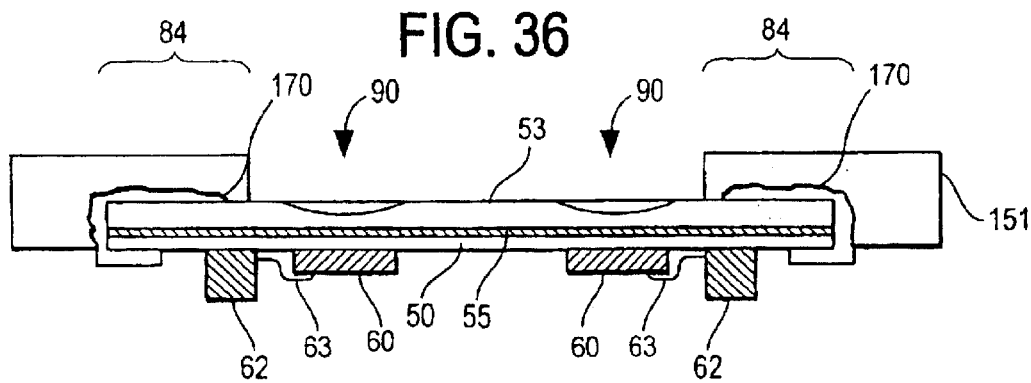

The embodiment depicted in FIG. 35 shows a glass layer 94 defining touch surfaces 90. In FIG. 35, substrate 151 is thermoformed or molded to form bezel 84 about the perimeter of touch switch carrier 50 and glass layer 94. Optional adhesive 55 can help secure the touch switch assembly, including glass layer 94 and touch switch carrier 50, to substrate 151. In FIG. 36, substrate 151 is thermoformed or molded to form bezel 84 using mechanical attachment devices 170, which can be anchors, score marks or other texture or any other suitable mechanical attachment structure. The embodiment depicted in FIG. 36 includes compliant layer 53 having touch surfaces 90.

Figure 37:
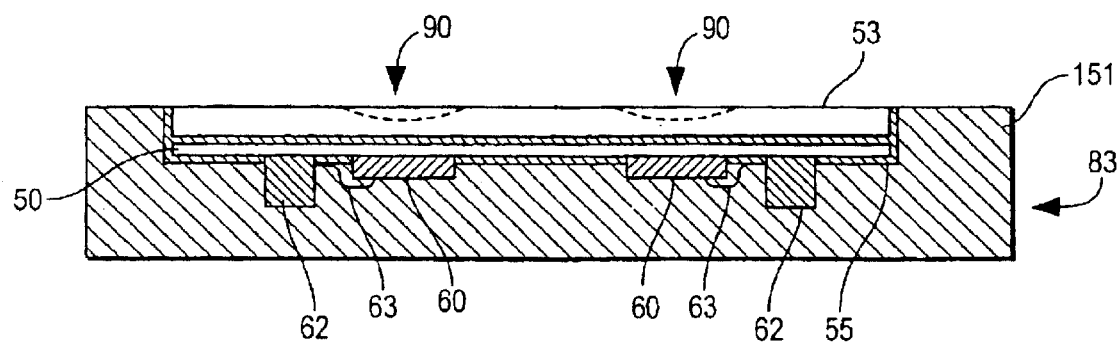
Figure 38:
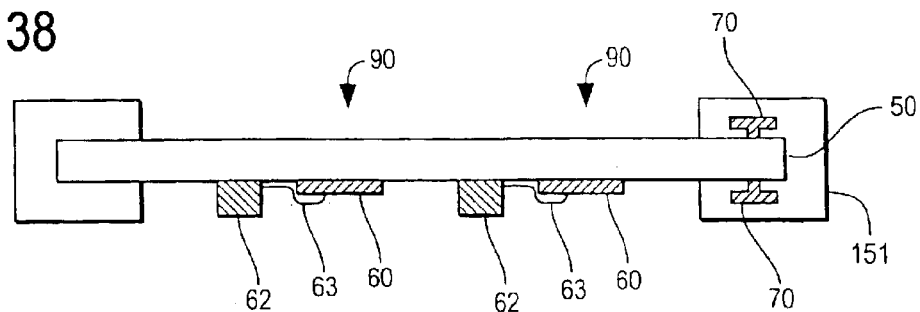
Figure 39:
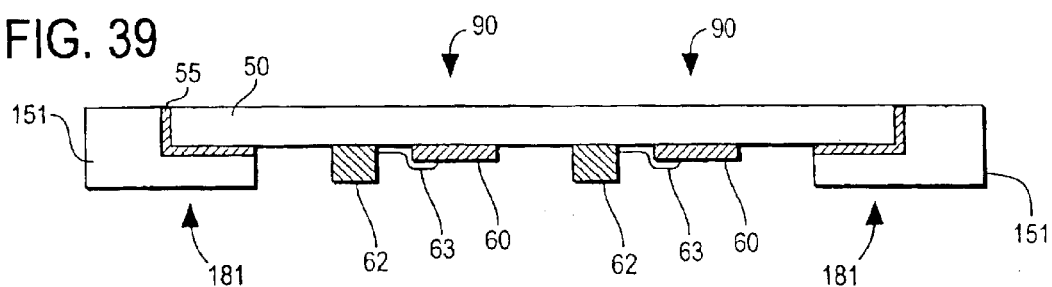
Figure 40:
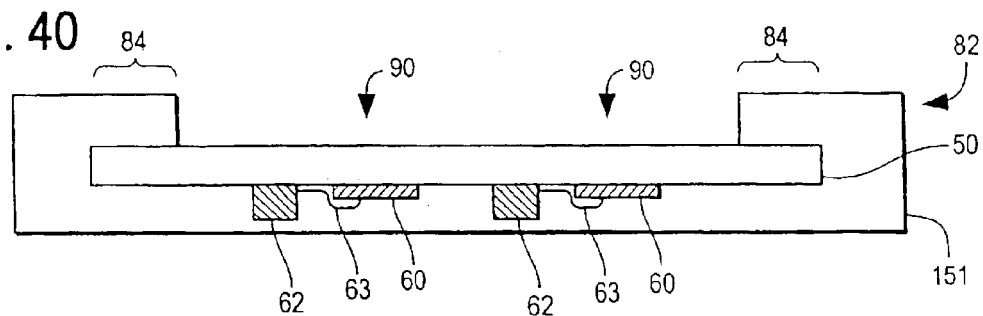
Figure 41:
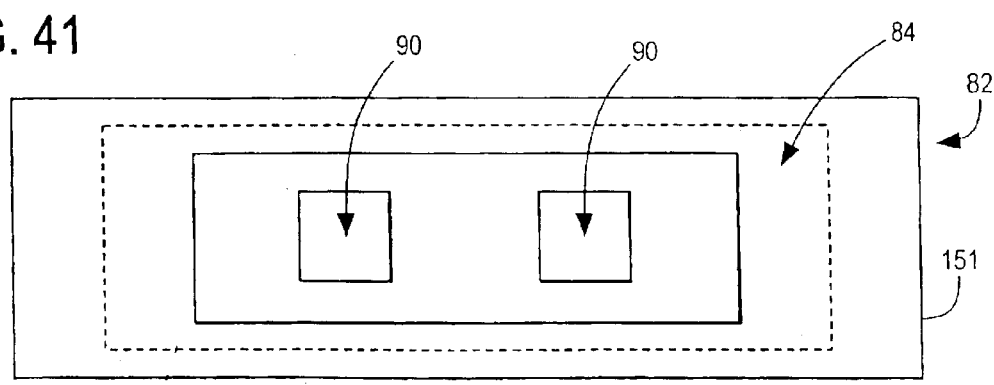

In FIG. 37, substrate 151 is molded to form housing 83, which conforms to touch switch carrier 50 and the components it bears, surrounding carrier 50 on one side and framing it about its perimeter. The attachment can be further ensured using an adhesive 55. In FIGS. 38–41, touch switch carrier 50 is preferably rigid and defines touch surfaces 90. In FIG. 38, substrate 151 is molded about the edges of touch switch carrier 50. On one end of touch switch carrier 50, anchors 70 help secure the two substrates together. Anchors 70 could be provided at other locations as well. In FIG. 39, substrate 151 is thermoformed or molded onto carrier 50 in combination with an optional adhesive layer 55. Shelf 181 provides a secure attachment, while substrate 151 does not interfere with touch surfaces 90 of touch switch carrier 50 or the side bearing touch surfaces 90. In FIG. 40, touch switch components, including electrodes 60, traces 63 and integrated control circuits 62, are encapsulated by molded substrate 151, formed into frame 82 having bezel 84 partly surrounding the perimeter of the cross section of carrier 50 shown. FIG. 41 shows a top view of the integrated touch switch of FIG. 40 including operative touch surfaces 90, frame 82 and bezel portion 84 of frame 82.

The various aspects of the present invention described above can be combined in any way according to the requirements of the application for which the touch switch is intended. For instance, a touch switch assembly can be injection molded or thermoformed or both in various steps in the manufacturing process as necessary to meet the requirements of the application. Also, the integrated touch switch/control panel assembly can assume any overall shape, including curved and flat, and can conform to any geometry required for the application. The substrates of any of the embodiments can bear other components, such as light sources, including LEDs, OLEDs, LEPs and light pipes according to the requirements of the application, and according to the invention described in U.S. Provisional Patent Application Serial No. 60/341,350 and its related U.S. patent application Ser. No. 10/271,438, entitled Integrated Touch Sensor and Light Apparatus, filed on Oct. 15, 2002 and naming David W. Caldwell as an inventor, or otherwise, and can be rigid, flexible or thermoformable, decorated, transparent or otherwise. In addition, the touch sensors and/or associated control circuits described in the above referenced U.S. patents are all compatible with the embodiments of the present invention described above. Although thermoforming and injection molding techniques have been described in detail above, it will be understood from this disclosure and the claims below that other techniques could be used to create the novel touch sensors described and claimed herein. Examples include ultrasonic forming techniques, use of epoxies which are moldable during assembly but which solidify thereafter, and so forth. The invention may also be embodied in other specific forms not explicitly depicted or described herein without departing from the invention's spirit or essential character. The described embodiments are to be considered in all respects only as illustrative and not restrictive. The scope of the invention is indicated by the appended claims rather than by the foregoing description. All changes which come within the meaning and range of equivalency of the claims therefore are to be embraced within that scope.

We claim:

1. An integrated touch switch and touch surface substrate assembly, comprising:
   at least one touch switch disposed on a carrier, said touch switch comprising at least a first electrode; and
   a touch surface substrate defining at least one operative touch surface corresponding to said at least one touch switch, said substrate comprising a moldable material;
   wherein said carrier is integrated with said touch surface substrate.

2. The assembly of claim 1 wherein said touch switch is a capacitive touch switch.

3. The assembly of claim 1 wherein said touch switch comprises an active component.

4. The assembly of claim 1 wherein said touch switch comprises an integrated circuit.

5. The assembly of claim 1 wherein said carrier is a substantially rigid substrate.

6. The assembly of claim 1 wherein said carrier is a flexible substrate.

7. The assembly of claim 1 wherein said carrier is a printed circuit board.

8. The assembly of claim 1 wherein said carrier further comprises a display.

9. The assembly of claim 1 wherein said moldable material comprises an injection moldable material.

10. The assembly of claim 1 wherein said moldable material comprises a thermoformable material.

11. The assembly of claim 1 wherein said moldable material comprises an epoxy.

12. The assembly of claim 1 further comprising an adhesive disposed between at least a portion of said carrier and at least a portion of said touch surface substrate.

13. The assembly of claim 1 wherein said touch surface substrate is molded about at least a portion of said carrier.

14. The assembly of claim 13 wherein said touch surface substrate encapsulates said carrier.

15. The assembly of claim 1 wherein at least a portion of said touch switch comprises a mechanical anchor, wherein said mechanical anchor is engaged with said touch surface substrate.

16. The assembly of claim 15 wherein said mechanical anchor comprises a rivet.

17. The assembly of claim 1 wherein at least one of said carrier and said touch surface substrate comprises a mechanical anchor, wherein said mechanical anchor is engaged with the other of said carrier and said touch surface substrate.

18. The assembly of claim 17 wherein said mechanical anchor comprises a rivet.

19. The assembly of claim 18 wherein said rivet further engages said first electrode.

20. The assembly of claim 17 wherein said mechanical anchor comprises a barb.

21. The assembly of claim 17 wherein said touch surface substrate comprises tactile locating means for facilitating tactile identification of said at least one operative touch surface.

22. The assembly of claim 21 wherein said tactile locating means comprises a raised ridge adjacent said operative touch surface.

23. The assembly of claim 22 wherein said raised ridge surrounds at least a portion of said operative touch surface.

24. The assembly of claim 21 wherein said tactile locating means comprises a dome-shaped structure proximate said operative touch surface.

25. The assembly of claim 24 wherein said dome-shaped structure is flexible.

26. The assembly of claim 24 wherein said dome-shaped structure is compressible.

27. The assembly of claim 21 wherein said tactile locating means comprises a depression in said touch surface substrate proximate said operative touch surface.

28. The assembly of claim 21 wherein said tactile locating means comprises surface texture integrated with said touch surface substrate proximate said operative touch surface.

29. The assembly of claim 1 wherein said touch surface substrate comprises visual locating means for facilitating visual identification of said at least one operative touch surface.

30. The assembly of claim 29 wherein said visual locating means comprises decoration proximate said at least one operative touch surface.

31. The assembly of claim 1 wherein said touch surface substrate comprises a compliant material.

32. The assembly of claim 31 further comprising a framing substrate overlying said touch surface substrate, said framing substrate defining at least one aperture corresponding to said operative touch surface.

33. The assembly of claim 1 wherein said touch surface substrate includes an aperture proximate said operative touch surface, said assembly frirther comprising a compliant material disposed within said aperture.

34. The assembly of claim 33 wherein each of said carrier and said first electrode includes an aperture corresponding to said aperture in said touch surface substrate, wherein said compliant material penetrates said carrier and said first electrode and engages at least one of said carrier and said first electrode.

35. The assembly of claim 1 wherein said assembly is three-dimensional.

36. The assembly of claim 1 wherein said assembly is non-planar.

37. The assembly of claim 1 wherein said touch switch is an electric field sensing touch switch.

38. The assembly of claim 1 wherein said touch switch is an infrared touch switch.

39. The assembly of claim 1 wherein said touch switch is an acoustic touch switch.

40. The assembly of claim 1 wherein said touch switch is an electromagnetic touch switch.

41. An integrated touch switch and touch surface substrate assembly, comprising:
   at least one touch switch disposed on a carrier, said touch switch comprising at least a first electrode; and
   a touch surface substrate defining at least one operative touch surface corresponding to said at least one touch switch, said substrate comprising a compliant material;
   wherein said carrier is integrated with said touch surface substrate.

42. The assembly of claim 41, further comprising a framing substrate overlying said touch surface substrate, said framing substrate defining at least one aperture corresponding to said operative touch surface.

43. The assembly of claim 42, at least one of said touch surface substrate and said framing substrate further comprising at least one mechanical anchor, said mechanical anchor engaged with the other of said touch surface substrate and said framing substrate.

44. The assembly of claim 41 further comprising a sealing substrate, said sealing substrate integrated with said carrier and said sealing substrate substantially encapsulating said touch switch.

45. The assembly of claim 44, said carrier further comprising at least one mechanical anchor, said mechanical anchor engaged with said sealing substrate.

46. An integrated touch switch and touch surface substrate assembly, comprising:
- at least one touch switch disposed on a carrier, said touch switch comprising at least a first electrode;
- a touch surface substrate defining at least one operative touch surface corresponding to said at least one touch switch; and
- a framing substrate, said framing substrate comprising a moldable material;
- wherein said carrier is integrated with said touch surface substrate, and
- wherein said carrier and said touch surface substrate are integrated with said framing substrate.

47. The assembly of claim 46, wherein said touch surface substrate comprises a compressible material.

48. The assembly of claim 46, wherein said touch surface substrate comprises tactile locating means for facilitating tactile identification of said at least one operative touch surface.

49. The assembly of claim 46, wherein said framing substrate is molded about at least a portion of said carrier and said touch surface substrate.

50. The assembly of claim 46, further comprising mechanical attachment means for facilitating the integration of said carrier and said touch surface substrate to said framing substrate.

51. An integrated touch switch and framing substrate assembly, comprising:
- at least one touch switch disposed on a carrier, a portion of said carrier defining an operable touch surface corresponding to said at least one touch switch;
- a framing substrate comprising a moldable material, said framing substrate integrated with said carrier.

52. The assembly of claim 51, wherein said framing substrate is molded about at least a portion of said carrier.

* * * * *

UNITED STATES PATENT AND TRADEMARK OFFICE
CERTIFICATE OF CORRECTION

PATENT NO. : 6,897,390 B2
DATED : May 24, 2005
INVENTOR(S) : Caldwell et al.

It is certified that error appears in the above-identified patent and that said Letters Patent is hereby corrected as shown below:

Column 15,
Line 64, delete "claim 17" and insert -- claim 1 --

Column 16,
Line 34, delete "frirther" and insert -- further --

Signed and Sealed this

Twelfth Day of July, 2005

JON W. DUDAS
*Director of the United States Patent and Trademark Office*